(12) United States Patent
Chang et al.

(10) Patent No.: US 12,243,930 B2
(45) Date of Patent: Mar. 4, 2025

(54) SEMICONDUCTOR DEVICE WITH FIN END SPACER DUMMY GATE AND METHOD OF MANUFACTURING THE SAME

(71) Applicant: TAIWAN SEMICONDUCTOR MANUFACTURING COMPANY, LTD., Hsinchu (TW)

(72) Inventors: Kai-Tai Chang, Kaohsiung (TW); Tung-Ying Lee, Hsinchu (TW); Wei-Sheng Yun, Taipei (TW); Tzu-Chung Wang, Hsinchu (TW); Chia-Cheng Ho, Hsinchu (TW); Ming-Shiang Lin, Hsinchu (TW); Tzu-Chiang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 68 days.

(21) Appl. No.: 17/875,144

(22) Filed: Jul. 27, 2022

(65) Prior Publication Data

US 2022/0367678 A1    Nov. 17, 2022

Related U.S. Application Data

(60) Division of application No. 16/562,416, filed on Sep. 5, 2019, now Pat. No. 11,444,174, which is a
(Continued)

(51) Int. Cl.
*H01L 29/66* (2006.01)
*H01L 21/306* (2006.01)
(Continued)

(52) U.S. Cl.
CPC .. *H01L 29/66545* (2013.01); *H01L 21/30604* (2013.01); *H01L 21/76224* (2013.01);
(Continued)

(58) Field of Classification Search
CPC ........... H01L 29/66545; H01L 27/0886; H01L 29/66795; H01L 29/785
See application file for complete search history.

(56) References Cited

U.S. PATENT DOCUMENTS 8,796,666 B1    8/2014  Huang et al.
8,987,142 B2    3/2015  Lee et al.
(Continued)

OTHER PUBLICATIONS

Non-Final Office Action issued in U.S. Appl. No. 16/104,692, dated Aug. 23, 2019.
(Continued)

*Primary Examiner* — Michele Fan
(74) *Attorney, Agent, or Firm* — STUDEBAKER BRACKETT PLLC

(57) ABSTRACT

A semiconductor device includes a first fin and a second fin in a first direction and aligned in the first direction over a substrate, an isolation insulating layer disposed around lower portions of the first and second fins, a first gate electrode extending in a second direction crossing the first direction and a spacer dummy gate layer, and a source/drain epitaxial layer in a source/drain space in the first fin. The source/drain epitaxial layer is adjacent to the first gate electrode and the spacer dummy gate layer with gate sidewall spacers disposed therebetween, and the spacer dummy gate layer includes one selected from the group consisting of silicon nitride, silicon oxynitride, silicon carbon nitride, and silicon carbon oxynitride.

20 Claims, 17 Drawing Sheets

Related U.S. Application Data continuation-in-part of application No. 16/104,692, filed on Aug. 17, 2018, now Pat. No. 10,797,174.

(51) Int. Cl.

| | | |
|---|---|---|
| *H01L 21/762* | (2006.01) | |
| *H01L 21/8234* | (2006.01) | |
| *H01L 27/088* | (2006.01) | |
| *H01L 29/08* | (2006.01) | |
| *H01L 21/265* | (2006.01) | |
| *H01L 21/308* | (2006.01) | |
| *H01L 21/3105* | (2006.01) | |
| *H01L 29/10* | (2006.01) | |
| *H01L 29/423* | (2006.01) | |

(52) U.S. Cl.
CPC ........... *H01L 21/823418* (2013.01); *H01L 21/823431* (2013.01); *H01L 21/823437* (2013.01); *H01L 21/823462* (2013.01); *H01L 21/823481* (2013.01); *H01L 27/0886* (2013.01); *H01L 29/0847* (2013.01); *H01L 29/66636* (2013.01); *H01L 21/26513* (2013.01); *H01L 21/3081* (2013.01); *H01L 21/3086* (2013.01); *H01L 21/31053* (2013.01); *H01L 29/1083* (2013.01); *H01L 29/42392* (2013.01)

(56) References Cited

U.S. PATENT DOCUMENTS

| | | |
|---|---|---|
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,362,181 B1 | 6/2016 | Xie et al. |
| 9,501,601 B2 | 11/2016 | Chang et al. |
| 9,548,303 B2 | 1/2017 | Lee et al. |
| 9,564,369 B1 | 2/2017 | Kim et al. |
| 9,653,583 B1 | 5/2017 | Zhao et al. |
| 9,876,114 B2 | 1/2018 | JangJian et al. |
| 9,882,023 B2 | 1/2018 | Lin et al. |
| 2014/0367795 A1 | 12/2014 | Cai et al. |
| 2015/0111351 A1 | 4/2015 | Kim et al. |
| 2015/0279995 A1 | 10/2015 | Maeda et al. |
| 2017/0025511 A1 | 1/2017 | Lee et al. |
| 2017/0084721 A1 | 3/2017 | Hung et al. |
| 2017/0330960 A1 | 11/2017 | Bauer et al. |
| 2018/0040613 A1 | 2/2018 | Chang et al. |
| 2018/0211955 A1 | 7/2018 | Greene et al. |
| 2019/0165146 A1 | 5/2019 | Ho et al. |
| 2019/0326158 A1* | 10/2019 | Chung ............. H01L 29/66545 |
| 2020/0027979 A1 | 1/2020 | Zang et al. |

OTHER PUBLICATIONS

Final Office Action issued in U.S. Appl. No. 16/104,692, dated Jan. 28, 2020.
Notice of Allowance issued in U.S. Appl. No. 16/562,416, dated May 18, 2020.
Non-Final Office Action issued in U.S. Appl. No. 16/562,416, dated Dec. 11, 2020.
Final Office Action issued in U.S. Appl. No. 16/562,416, dated May 28, 2021.
Notice of Allowance issued in U.S. Appl. No. 16/562,416, dated May 3, 2022.

* cited by examiner

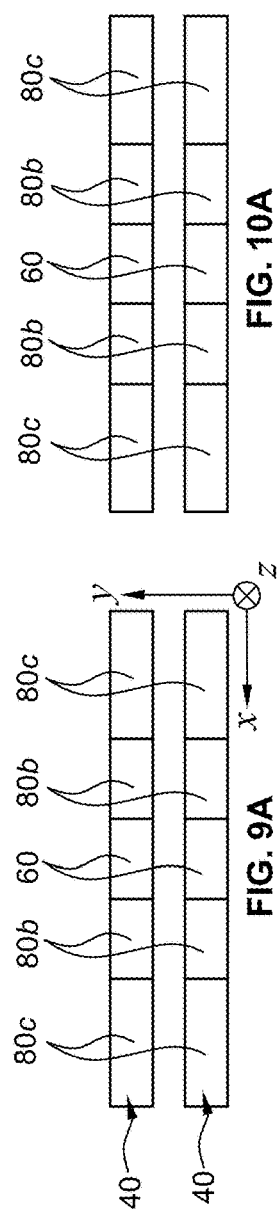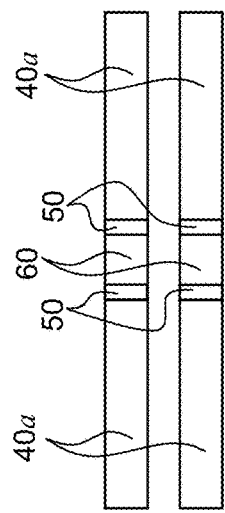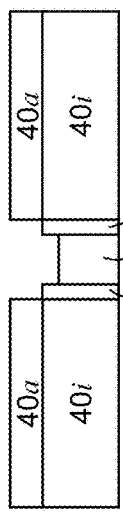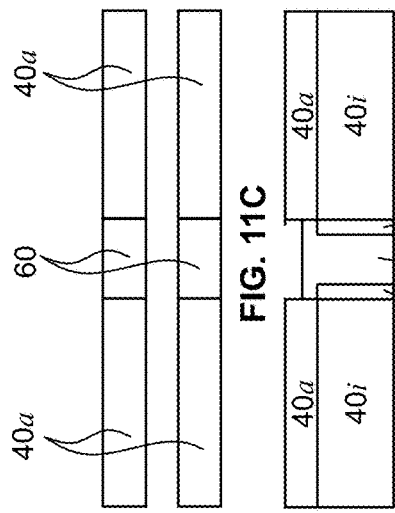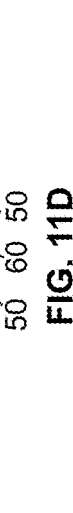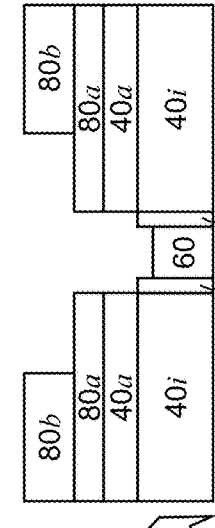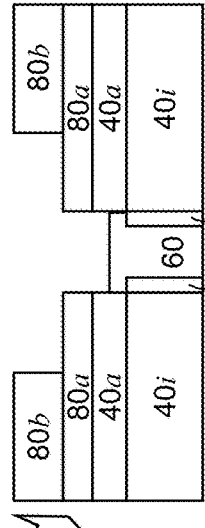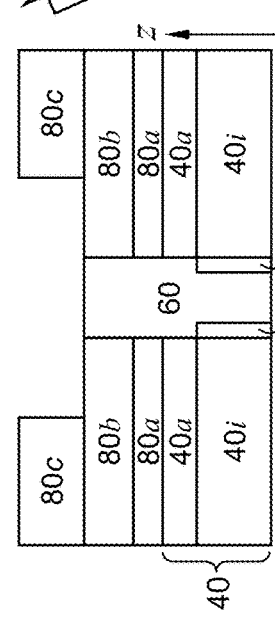

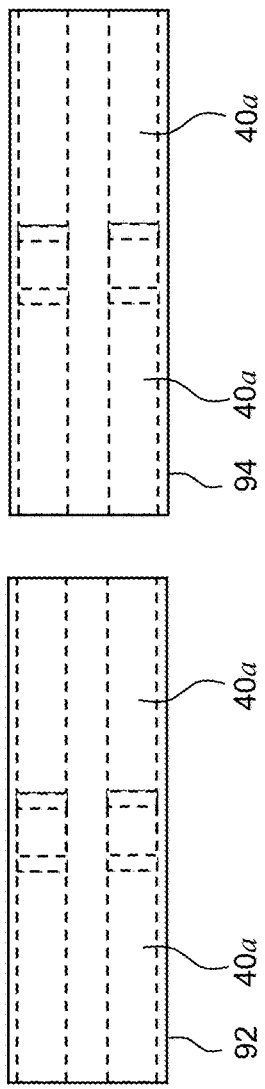
FIG. 12A
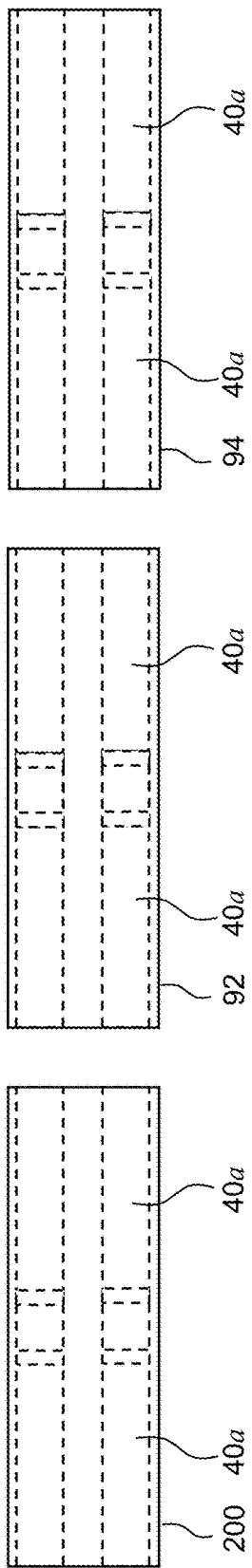
FIG. 13A
FIG. 14A
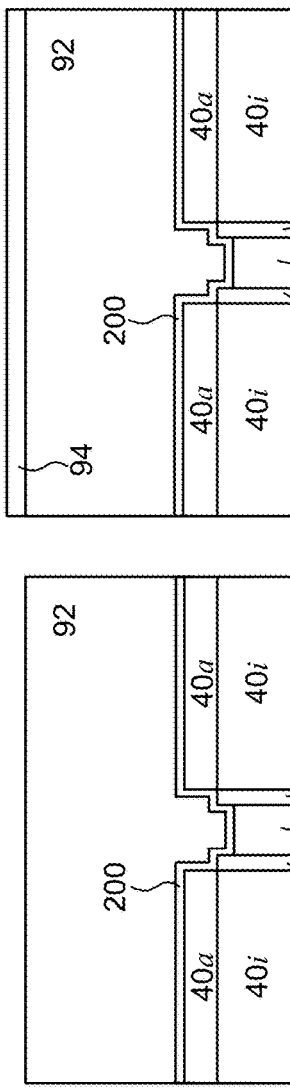
FIG. 12B
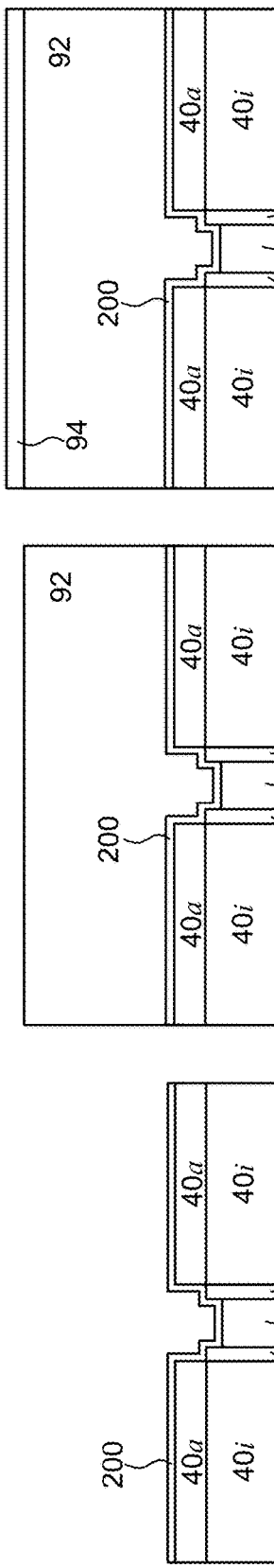
FIG. 13B
FIG. 14B
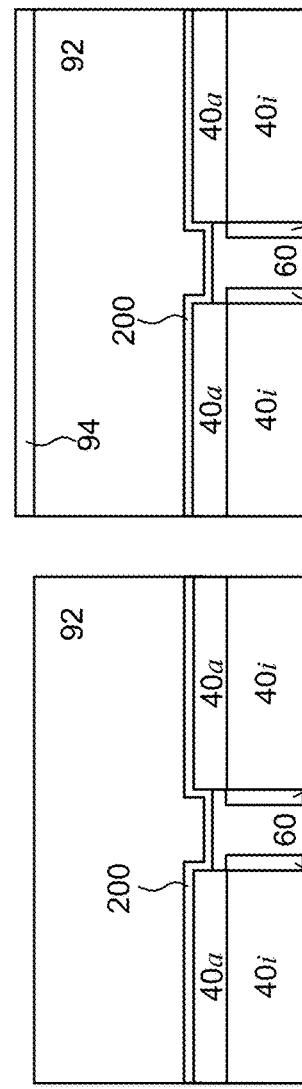
FIG. 12C
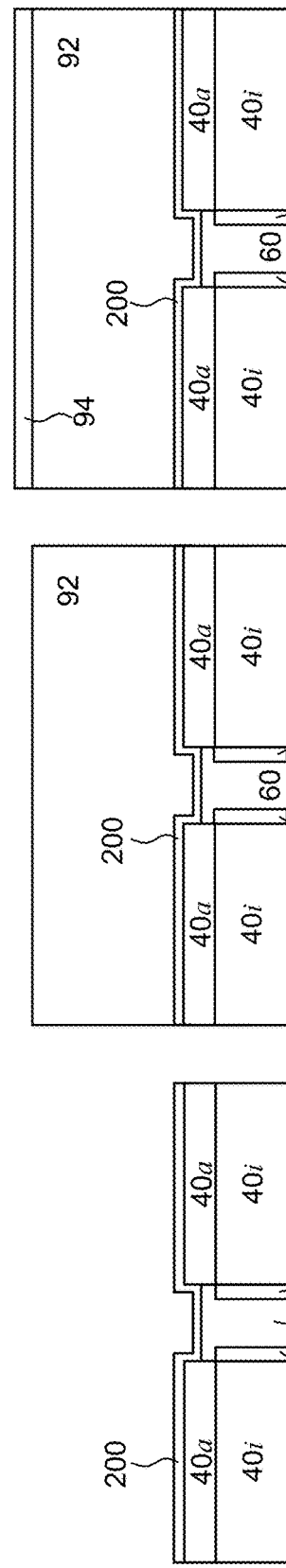
FIG. 13C
FIG. 14C

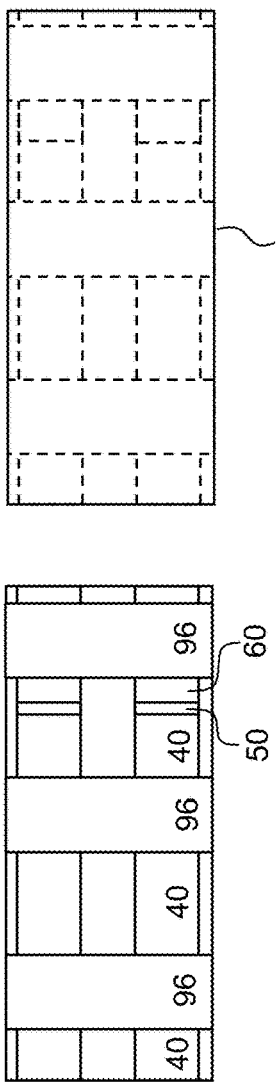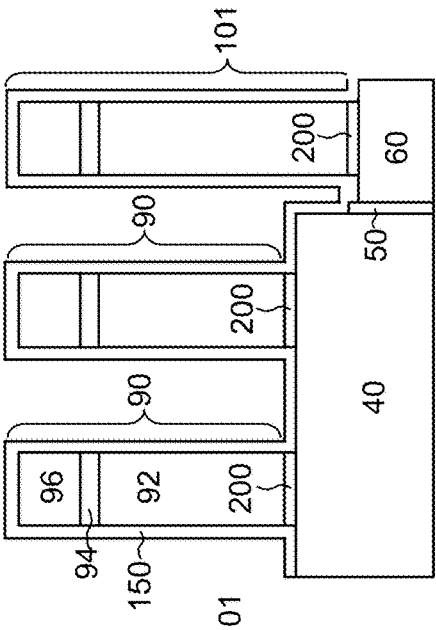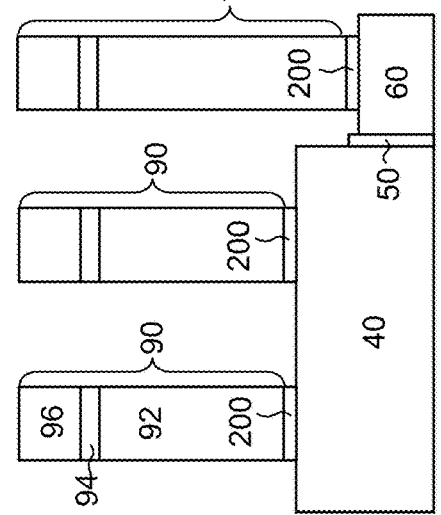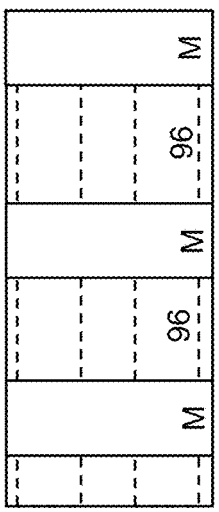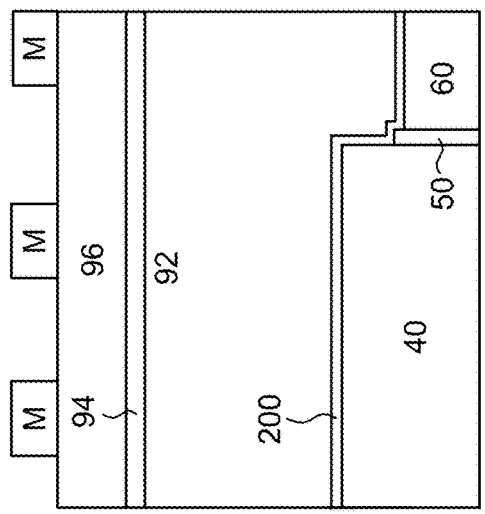

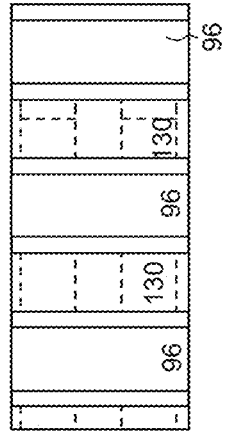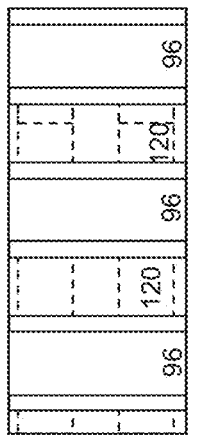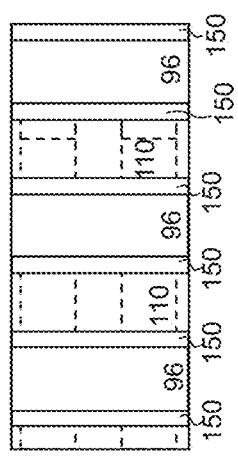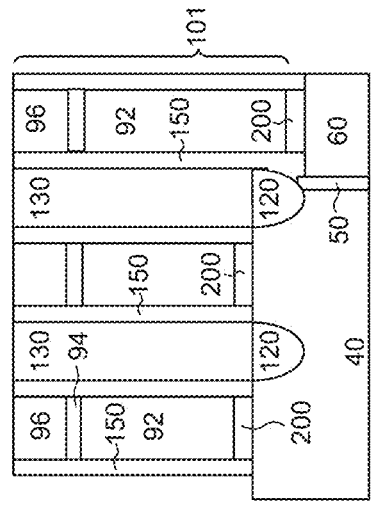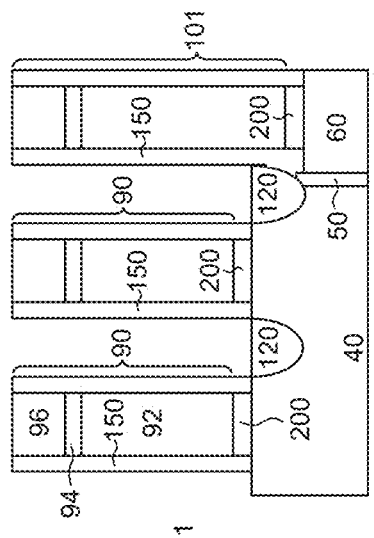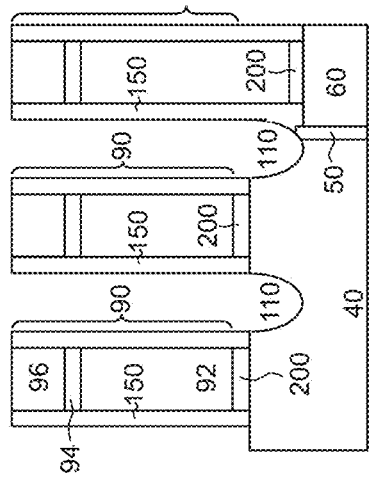

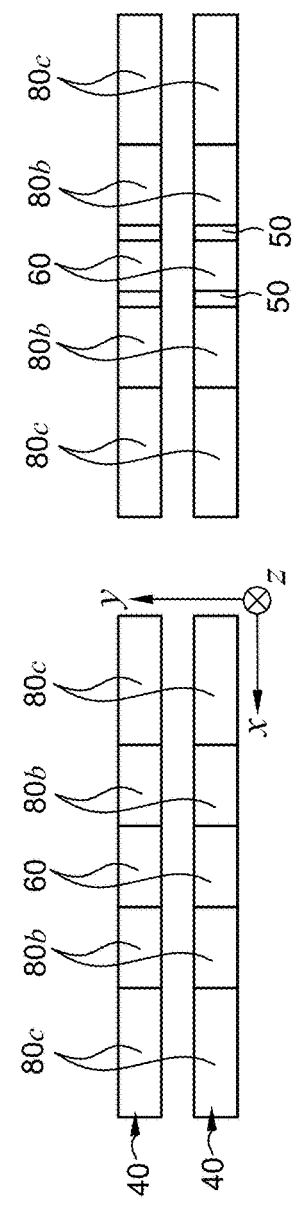
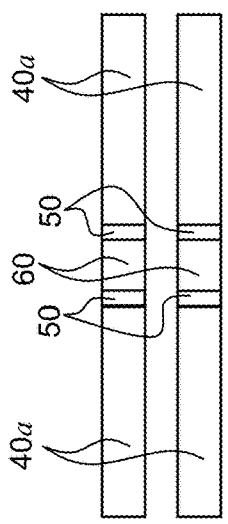
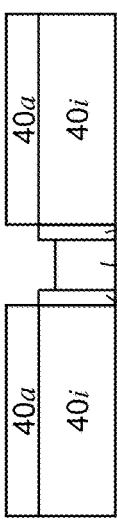
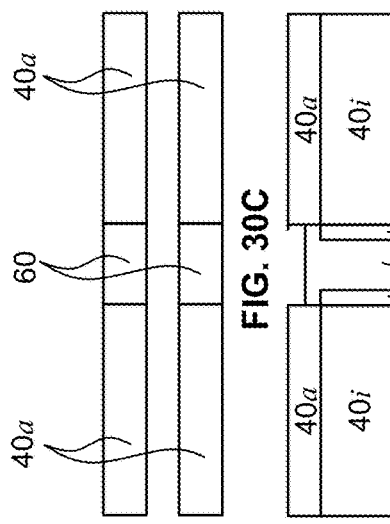
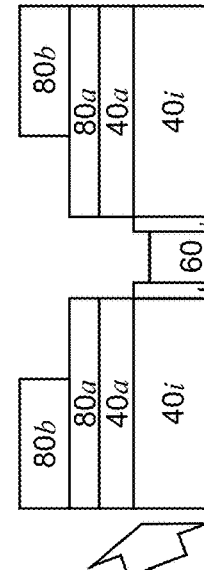
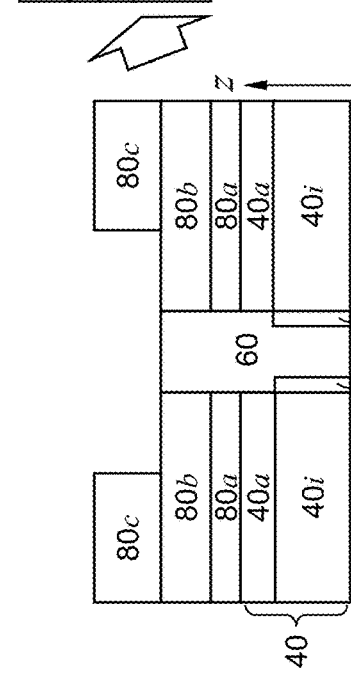
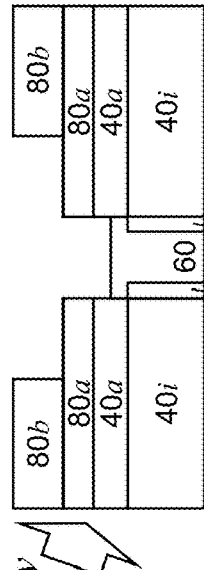
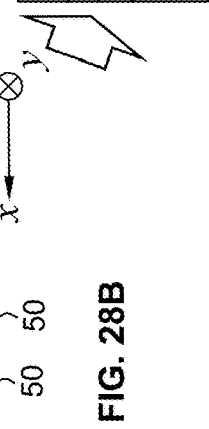

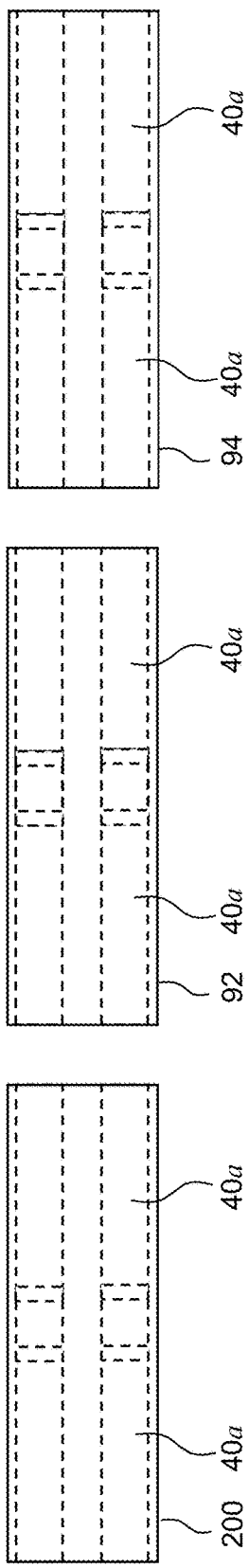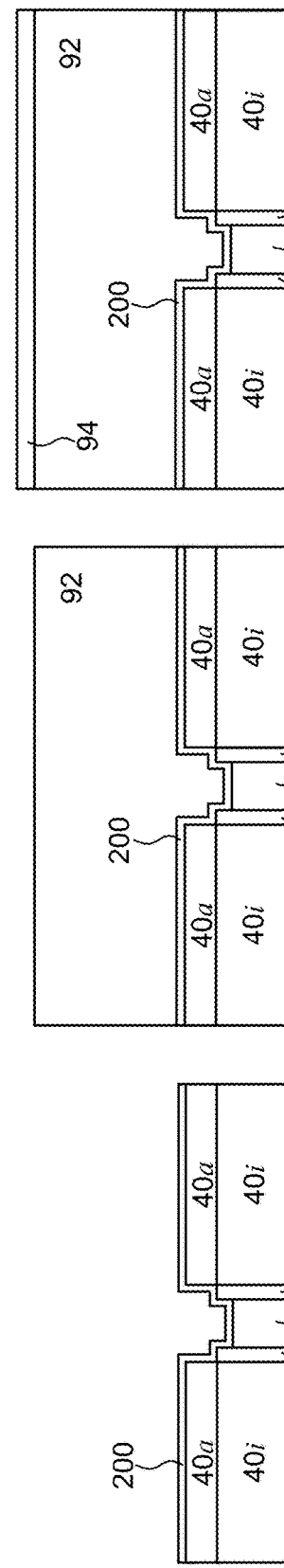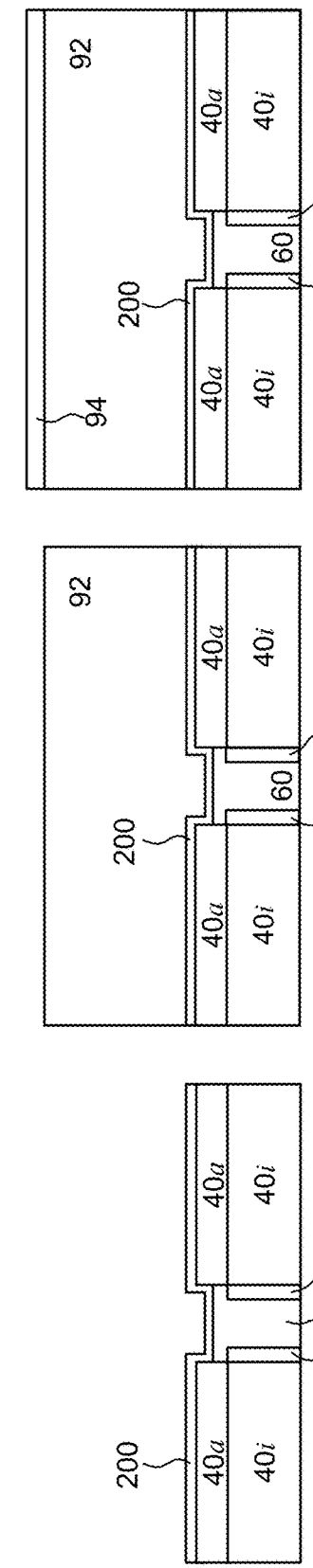

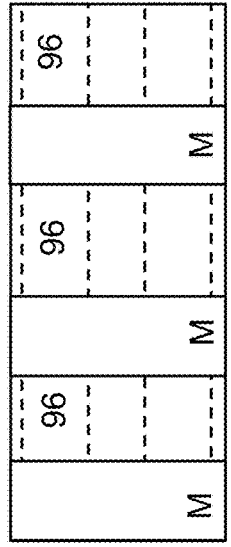
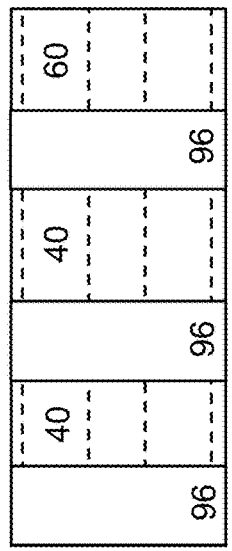
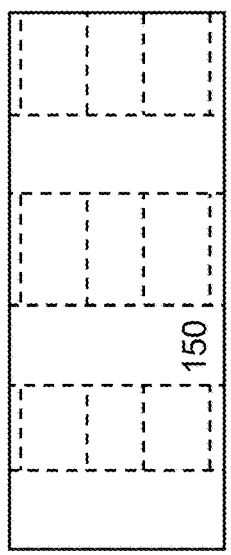
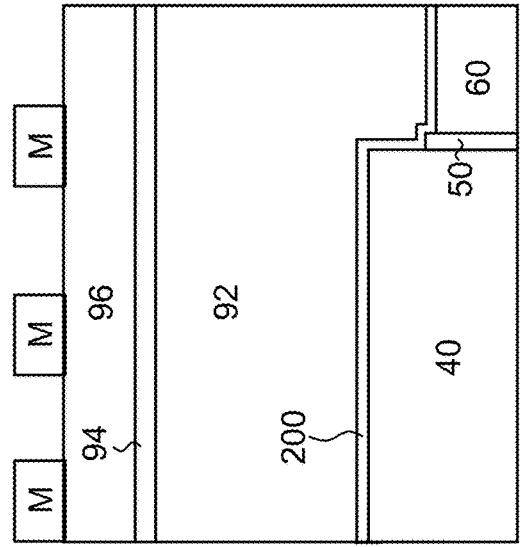
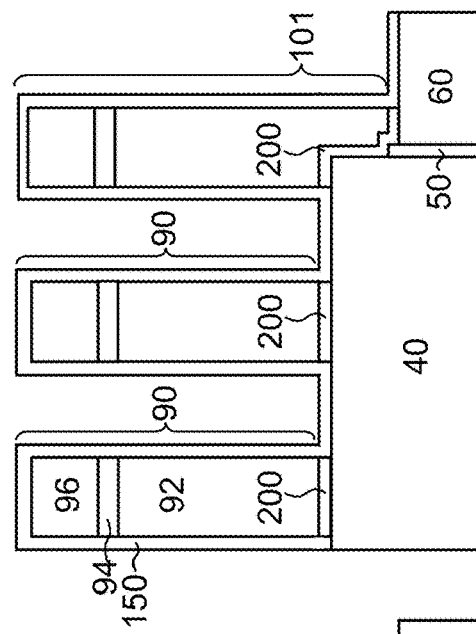

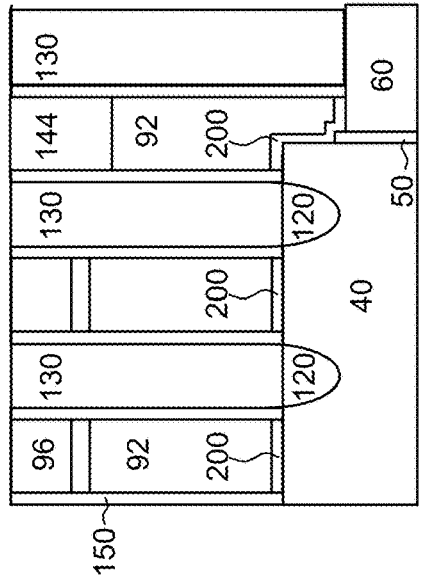
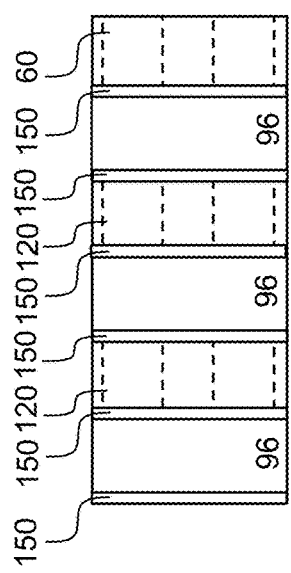 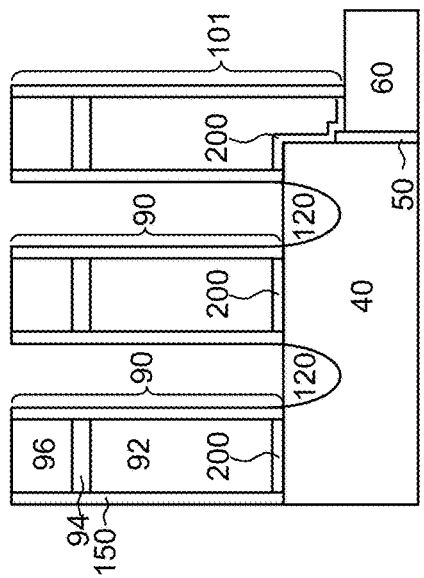
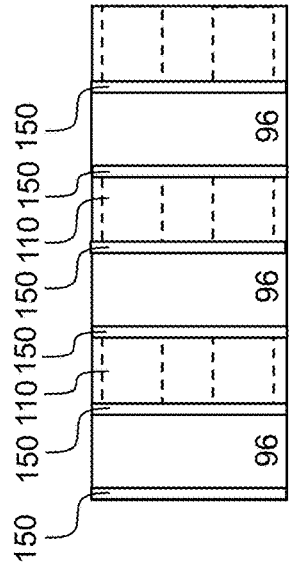 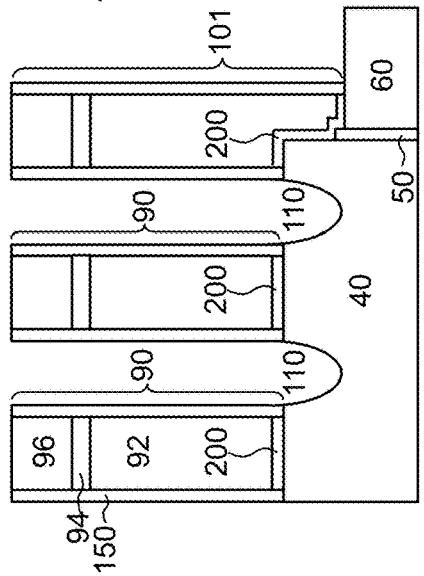

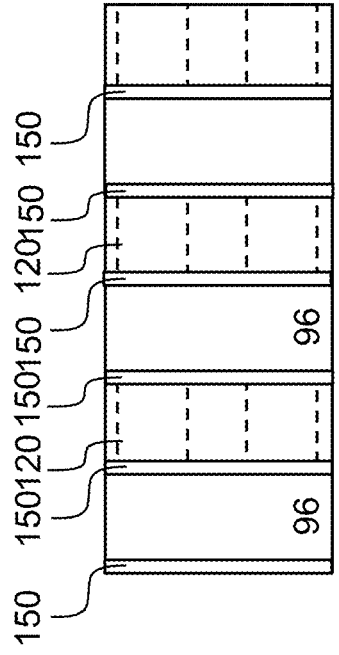
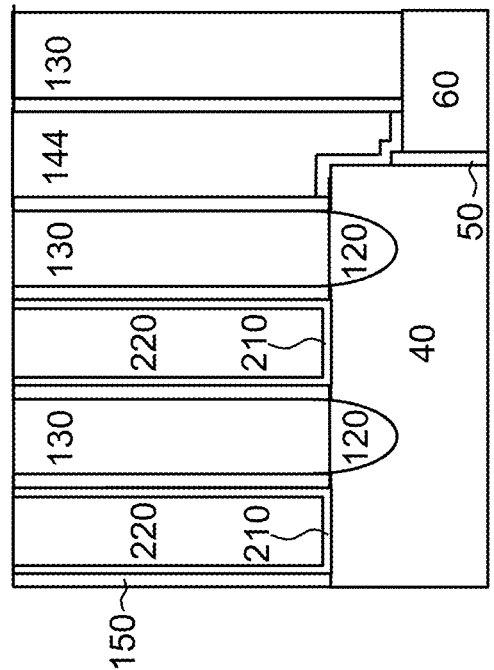
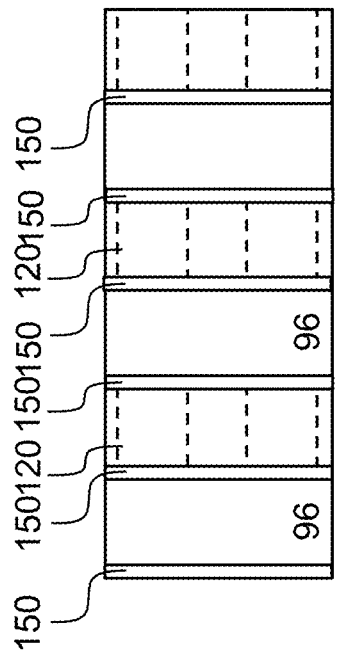
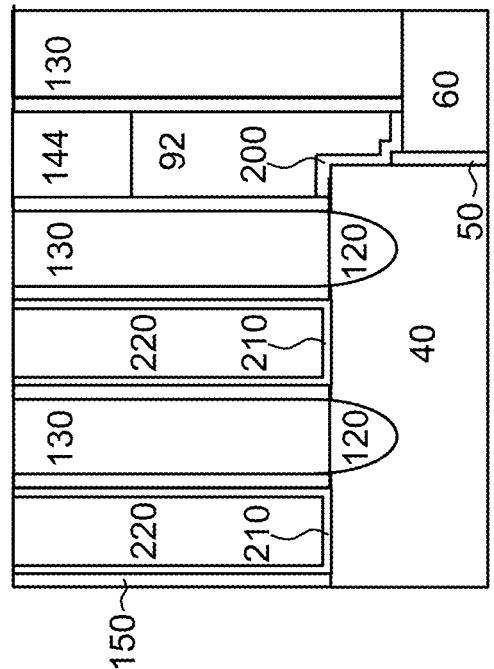

SEMICONDUCTOR DEVICE WITH FIN END SPACER DUMMY GATE AND METHOD OF MANUFACTURING THE SAME

RELATED APPLICATION

This application is a divisional of U.S. patent application Ser. No. 16/562,416 filed Sep. 5, 2019, which is a continuation-in-part of U.S. patent application Ser. No. 16/104,692 filed Aug. 17, 2018, now U.S. Pat. No. 10,797,174, the entire contents of each of which are incorporated herein by reference.

TECHNICAL FIELD

The disclosure relates to methods of manufacturing fin field effect transistors (FinFETs) and/or gate-all-around (GAA) field effect transistors (FETs) for semiconductor integrated circuits, and more particularly to methods of manufacturing fin end spacer dummy gates to protect a source/drain epitaxial layer, and semiconductor devices.

BACKGROUND

Traditional planar thin film devices provide superior performance with low power consumption. To enhance the device controllability and reduce the substrate surface area occupied by the planar thin film devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin field effect transistor (FinFET) and a gate-all-around (GAA) field effect transistor (FET). In a FinFET, a gate electrode is adjacent to three side surfaces of a channel region with a gate dielectric layer interposed therebetween. Because the gate structure surrounds (wraps) the fin on three surfaces (i.e., the top surface and the opposite lateral surfaces), the transistor essentially has three gates controlling (one gate at each of the top surface and the opposite lateral surfaces) the current through the fin or channel region. The fourth side of the bottom of the channel is far away from the gate electrode and thus is not under close gate control. In contrast, in a GAA FET, all side surfaces (i.e. the top surface, the opposite lateral surfaces, and the bottom surface) of the channel region are surrounded by the gate electrode, which allows for fuller depletion in the channel region and results in reduced short-channel effect due to steeper sub-threshold current swing (SS) and smaller drain induced barrier lowering (DIBL). As transistor dimensions are continually scaled down to sub 10-15 nm technology nodes, further improvements of the FinFETs and/or GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9A, 9B, 10A, 10B, 10C, 11A, 11B, 11C, 11D, 12A, 12B, 12C, 13A, 13B, 13C, 14A, 14B, 14C, 15A, 15B, 16A, 16B, 17A, 17B, 18A, 18B, 19A, 19B, 20A, 20B, 21A, 21B, 22A, 22B, 23A, 23B, 24A, 24B, 25A, and 25B show operations of manufacturing a semiconductor FinFET device according to an embodiment of the present disclosure. Each of FIGS. 9A, 10A, 11A, 12A, 13A, 14A, 15A, 16A, 17A, 18A, 19A, 20A, 21A, 22A, 23A, 24A, and 25A includes a top plan view and each of FIGS. 9B, 9C, 10B, 10C, 11B, 11C, 12B, 12C, 13B, 13C, 14B, 14C, 15B, 16B, 17B, 18B, 19B, 20B, 21B, 22B, 23B, 24B and 25B includes a cross-sectional view of the semiconductor FinFET device along a cut line A-A' in a plane including x and z axes of FIG. 7.

FIGS. 28A, 28B, 29A, 29B, 29C, 30A, 30B, 30C, 30D, 31A, 31B, 31C, 32A, 32B, 32C, 33A, 33B, 33C, 34A, 34B, 35A, 35B, 36A, 36B, 37A, 37B, 38A, 38B, 39A, 39B, 40A, 40B, 41A, 41B, 42A, 42B, 43A, and 43B show operations of manufacturing a semiconductor FinFET device according to an embodiment of the present disclosure. Each of FIGS. 28A, 29A, 30A, 30C, 31A, 32A, 33A, 34A, 35A, 36A, 37A, 38A, 39A, 40A, 41A, 42A, and 43A includes a top plan view and each of FIGS. 28B, 29B, 29C, 30B, 30D, 31B, 31C, 32B, 32C, 33B, 33C, 34B, 35B, 36B, 37B, 38B, 39B, 40B, 41B, 42B and 43B includes a cross-sectional view of the semiconductor FinFET device along a cut line A-A' in a plane including x and z axes of FIG. 26.

DETAILED DESCRIPTION

Figure 2:
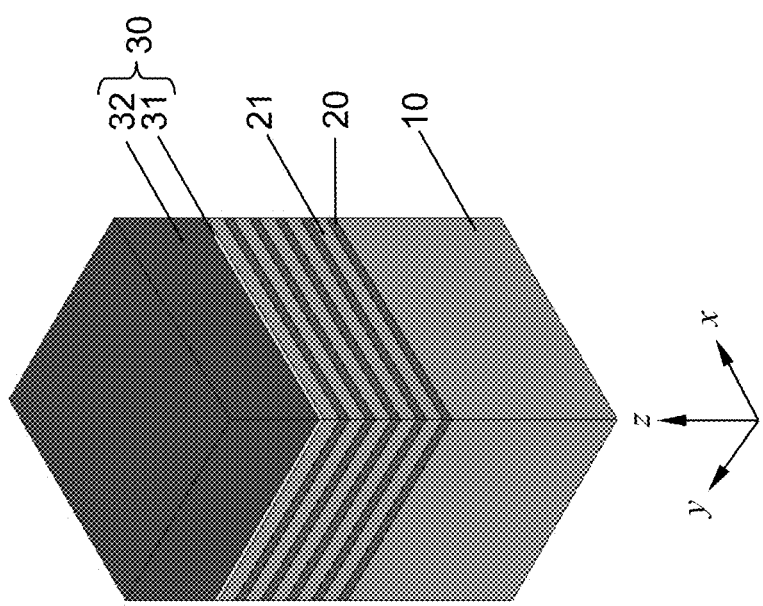
FIG. 2 shows a schematic view of stacked semiconductor layers formed over the processed substrate of FIG. 1 according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In this disclosure, a source/drain refers to a source and/or a drain. It is noted that in the present disclosure, a source and a drain are interchangeably used and the structures thereof are substantially the same.

During the manufacturing process of a semiconductor FET device having source/drain epitaxial layers, overlay shift may occur and cause misalignment of the structures, e.g. dummy polycrystalline silicon structures formed on an edge of a fin end region for protection of the edge of the fin end region. The dummy polycrystalline silicon structure is called a 'dummy structure' because it will be subsequently removed and is not part of the circuitry. Overlay shift, however, may shift the position of the dummy polycrystalline silicon structure formed at the edge of a fin end region to a region away from the fin end, forming a narrow gap adjacent to the fin end. This narrow gap does not allow a complete formation of a protective layer, e.g. sidewall layer, and prevents the protective layer from carrying out its designed function (e.g. shielding the source/drain epitaxial layer from etchant). This may lead to defects such as a damaged source/drain epitaxial layer by etching with a loss of material of the source/drain epitaxial layer and/or a chemical alteration of the source/drain epitaxial layer. Such defects could cause the entire wafer to be defective and, therefore, discarded. When the gap is sufficiently wide due to overlay shift, the protective layer can still be formed completely and the overlay shift does not cause the defect formation.

Much effort has been applied to model overlay so as to solve the overlay shift problem. For example, the linear overlay model is designed for such purpose. Without negligible field to field and wafer to wafer overlay variations, the total overlay shift in a specific in-plane direction along a major surface of the wafer is equal to the sum of the translation overlay parameter, magnification overlay parameter, rotation overlay parameter, and a residual overlay parameter. Along with the downscaling of device dimension to nanoscale, the control of overlay shift is critical to the critical dimension (CD) variability. Embodiments of the present disclosure are described therein.

Figure 1:
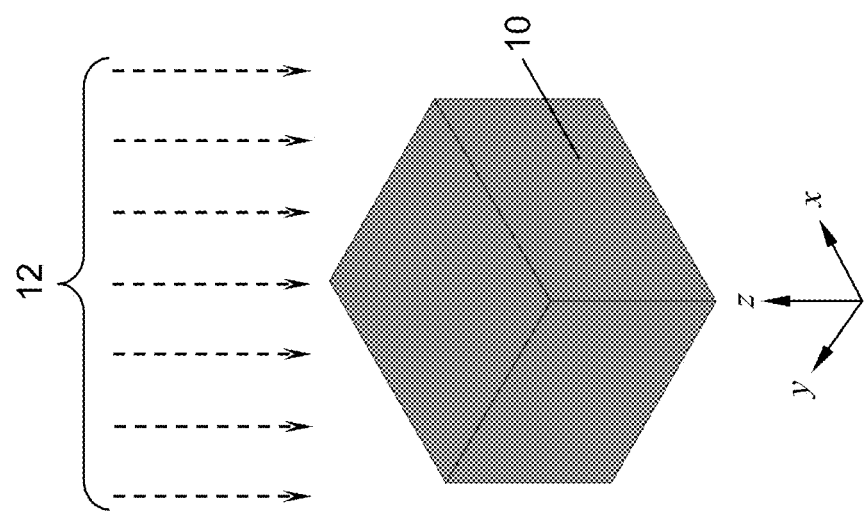
FIG. 1 shows a schematic view of a processing operation of a substrate according to an embodiment of the present disclosure.

As shown in FIG. 1, impurity ions (dopants) 12 are implanted into a semiconductor substrate 10 to form a well region. The ion implantation is performed to prevent a punch-through effect. In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments of the present disclosure, the substrate 10 includes various regions that have been suitably doped with impurities (e.g., p-type or n-type conductivity). The dopants 12 are, for example, boron ($BF_2$) for an n-type FinFET and phosphorus for a p-type FinFET.

In FIG. 2, stacked semiconductor layers are formed over the substrate 10, in a case where a gate all-around (GAA) field effect transistor (FET) is fabricated. The stacked semiconductor layers include first semiconductor layers 20 and second semiconductor layers 21. The first semiconductor layers 20 and the second semiconductor layers 21 are formed of materials having different lattice constants, and include one or more layers of Si, Ge, SiGe, GaAs, InSb, GaP, GaSb, InAlAs, InGaAs, GaSbP, GaAsSb or InP, according to some embodiments of the present disclosure.

In some embodiments, the first semiconductor layers 20 and the second semiconductor layers 21 are formed of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 21 are Si or $Si_{1-y}Ge_y$, where y is less than about 0.4 and x>y. In this disclosure, an "M" compound" or an "M based compound" means the majority of the compound is M.

In another embodiment, the second semiconductor layers 21 are $Si_{1-y}Ge_y$, where y is more than about 0.3, or Ge, and the first semiconductor layers 20 are Si or $Si_{1-x}Ge_x$, where x is less than about 0.4 and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4.

Also, in FIG. 2, five layers of the first semiconductor layer 20 and six layers of the second semiconductor layer 21 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 21 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 21 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer 20 (the closest layer 20 to the substrate 10) is thicker than the remaining first semiconductor layers 20. The thickness of the bottom first semiconductor layer 20 is in a range from about 10 nm to about 50 nm in some embodiments, or is in a range from about 20 nm to about 40 nm in other embodiments.

Further, in FIG. 2, a mask layer 30 is formed over the stacked layers 20 and 21. In some embodiments, the mask layer 30 includes a first mask layer 31 and a second mask layer 32. The first mask layer 31 is a pad oxide layer made of a silicon oxide, which can be formed by a thermal oxidation. The second mask layer 32 is made of a silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photo-lithography and etching. In some embodiments, the first mask layer 31 is made of silicon nitride and the second mask layer 32 is made of silicon oxide.

Figure 3A:
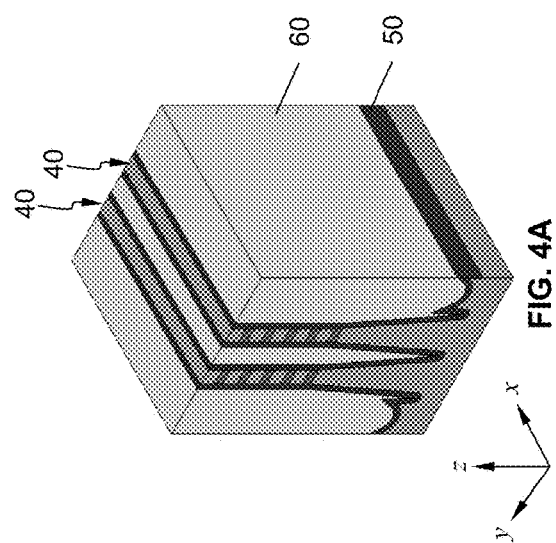
FIG. 3A shows a schematic view of fin structures made from the substrate and the stacked layers formed on the substrate of FIG. 2 according to an embodiment of the present disclosure.
Figure 3B:
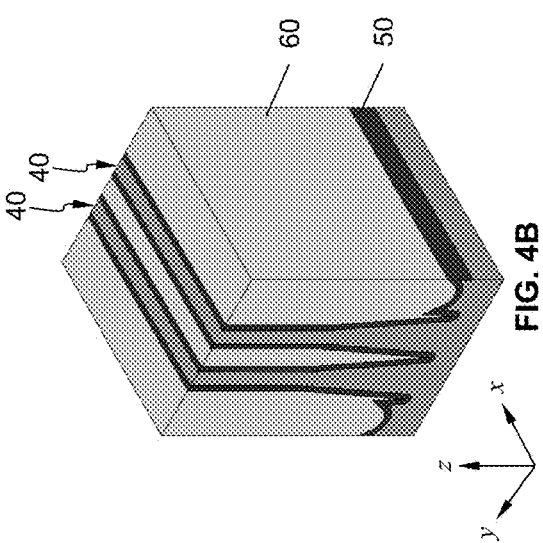
FIG. 3B shows a schematic view of fin structures according to another embodiment of the present disclosure.
Figure 4A:
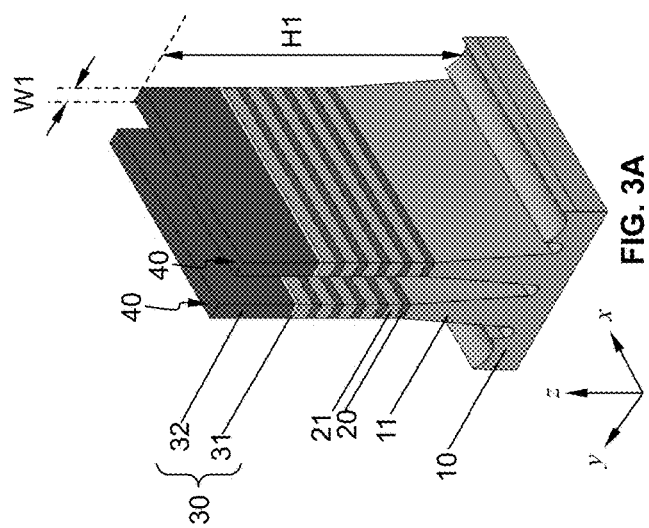
FIG. 4A shows a schematic view of the processed substrate of FIG. 3A according to an embodiment of the present disclosure.
Figure 4B:
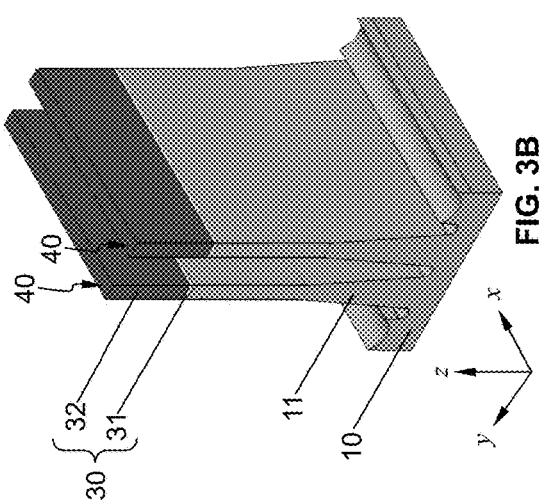
FIG. 4B shows a schematic view of the processed substrate of FIG. 3B according to another embodiment of the present disclosure.

When the semiconductor device is a FinFET, no stacked layers are formed (see FIGS. 3B and 4B). In some embodiments, one or more epitaxial layers for a channel region are formed over the substrate 10. For GAA FET devices, operations shown in FIGS. 3A and 4A are applied. In FIG. 3A, the stacked layers of the first and second semiconductor layers 20, 21 are patterned by using the patterned mask layer 30, thereby the stacked layers 20 and 21 are formed into fin structures 40 extending in a lengthwise direction along the x direction. In some embodiments of the present disclosure, the fin structures 40 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In FIG. 3A, two fin structures 40 are arranged in they direction but the number of the fin structures 40 is not limited to two, and may be as small as one and three or more in some embodiments of the present disclosure. In some embodiments, one or more dummy fin structures are formed on both sides of the fin structures 40 to improve pattern fidelity in the patterning operations. As shown in FIG. 3A, the fin structures 40 have upper portions constituted by the stacked semiconductor layers 20, 21 and well portions 11. The width W1 of the upper portion of the fin structure 40 along they direction is in a range from about 10 nm to about 40 nm in some embodiments, and is in a range from about 20 nm to about 30 nm in other embodiments. The height H1 along the z direction of the fin structure 40 is in a range from about 100 nm to about 200 nm.

FIG. 3B shows the case for a FinFET device. For a FinFET device, the substrate 10 (and/or an epitaxial layer formed over the substrate) is etched to form one or more fin structures. In FIG. 3B, the mask layer 30, including first mask layer 31 and second mask layer 32, formed on the substrate 10 is patterned and then by using the patterned mask layer 30, the substrate 10 is formed into fin structures 40 extending lengthwise along the x direction. In FIG. 3B, two fin structures 40 are arranged in they direction but the number of the fin structures 40 is not limited to two, and may be as small as one and three or more in some embodiments of the present disclosure, depending on the desired device performance and device architecture. In some embodiments, one or more dummy fin structures (not shown) are formed on both sides of the fin structures 40, i.e. between the two fin structures 40, to improve pattern fidelity in the patterning operations such as photolithographic patterning of the mask layer 30. As shown in FIG. 3B, the substrate 10 has well portions 11.

After the fin structures 40 are formed in FIG. 3A or FIG. 3B, an insulating material layer 60 including one or more layers of insulating material is formed over the substrate 10 in FIG. 4A or FIG. 4B so that the fin structures 40 are fully embedded in the insulating material layer 60. The insulating material for the insulating material layer 60 includes silicon oxide, silicon nitride, silicon oxynitride, silicon carbon nitride, silicon carbon oxynitride, fluorine-doped silicate glass (FSG), or a low-k dielectric material, formed by LPCVD (low pressure chemical vapor deposition), plasma-CVD or flowable CVD. An anneal operation is performed after the formation of the insulating layer 60 in some embodiments of the present disclosure. Then, a planarization operation, such as a chemical mechanical polishing (CMP) method and/or an etch-back method, is performed such that the upper surface of the uppermost second semiconductor layer 21 or fin structure 40 is exposed from the insulating material layer 60 as shown in FIGS. 4A and 4B. In some embodiments, the first and second mask layers 31 and 32 are removed by the CMP as shown in FIGS. 4A and 4B, and in other embodiments, the CMP operation stops on the second mask layer 32. In some embodiments, a first liner layer or fin liner 50 is formed over the structure of FIGS. 3A and 3B before forming the insulating material layer 60, as shown FIG. 4A or FIG. 4B. The fin liner or first liner layer 50 is formed of silicon nitride or a silicon nitride-based material (e.g., silicon oxynitride SiON, silicon carbon nitride SiCN, or silicon carbon oxynitride SiCON).

Figure 5A:
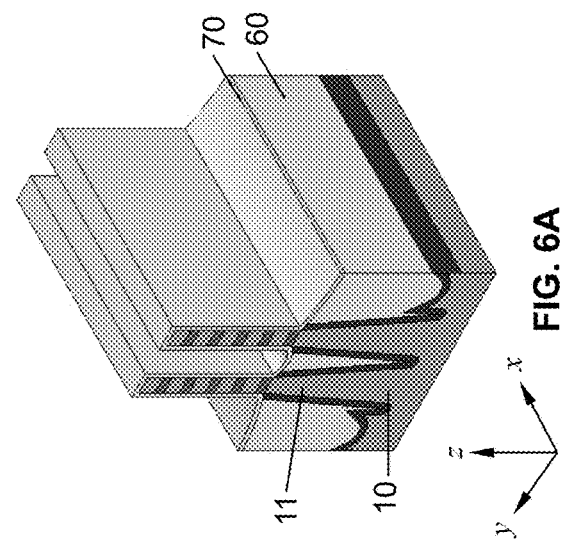
FIG. 5A shows a schematic view of the processed substrate of FIG. 4A according to an embodiment of the present disclosure.
Figure 5B:
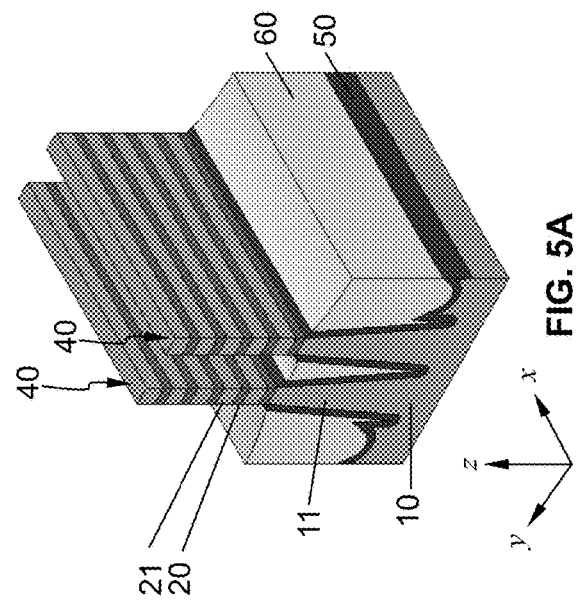
FIG. 5B shows a schematic view of the processed substrate of FIG. 4B according to another embodiment of the present disclosure.

Then, as shown in FIG. 5A or FIG. 5B, the insulating material layer 60 is recessed to form an isolation insulating layer 60 so that the upper portions of the fin structures 40 are exposed. With this operation, the substrate 10 and the well portions 11 of the fin structures 40 are electrically separated from each other by the isolation insulating layer 60, which is also called a shallow trench isolation (STI) layer. In the embodiment shown in FIG. 5A, the insulating material layer 60 is recessed until the bottommost first semiconductor layer 20 is exposed. In other embodiments of the present disclosure, the upper portion of the well layer 11 is also partially exposed. The first semiconductor layers 20 are sacrificial layers which are subsequently partially removed, and the second semiconductor layers 21 are subsequently formed into channel layers of a GAA FET device.

Figure 6A:
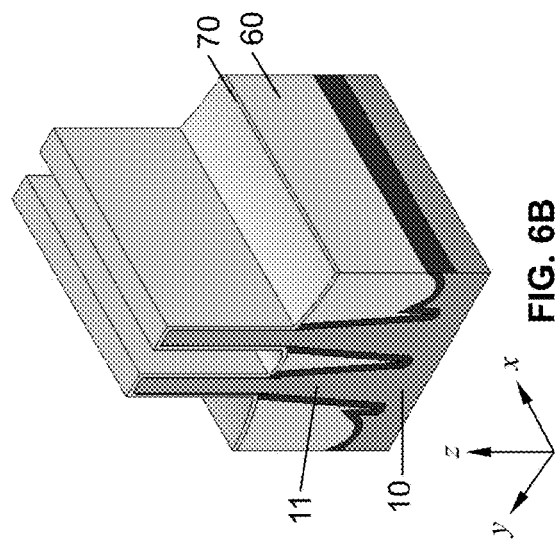
FIG. 6A shows a schematic view of the processed substrate of FIG. 5A according to an embodiment of the present disclosure.
Figure 6B:
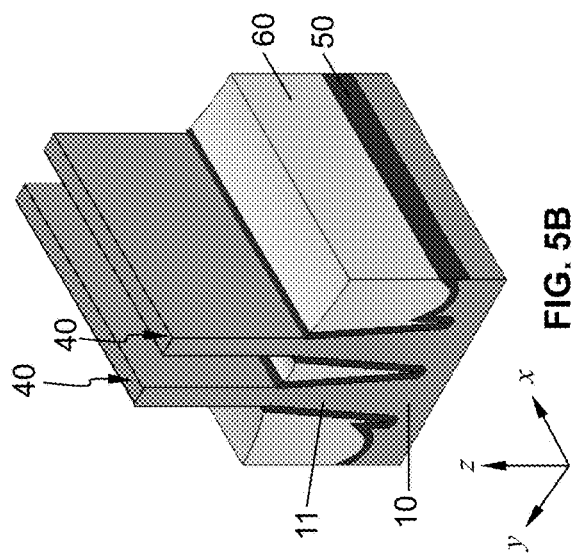
FIG. 6B shows a schematic view of the processed substrate of FIG. 5B according to another embodiment of the present disclosure.

After the isolation insulating layer 60 is formed, a sacrificial gate dielectric layer 70 is formed, as shown in FIG. 6A or FIG. 6B. The sacrificial gate dielectric layer 70 includes one or more layers of insulating material, such as a silicon oxide-based material including $SiO_2$. In one embodiment, silicon oxide formed by chemical vapor deposition (CVD), including low pressure CVD (LPCVD) and plasma enhanced CVD (PECVD), physical vapor deposition (PVD), atomic layer deposition (ALD), or other suitable process is used. The thickness of the sacrificial gate dielectric layer 70 is in a range from about 1 nm to about 5 nm in some embodiments of the present disclosure. The sacrificial gate dielectric layer 70 is formed over the fin structure 40.

Figure 8:
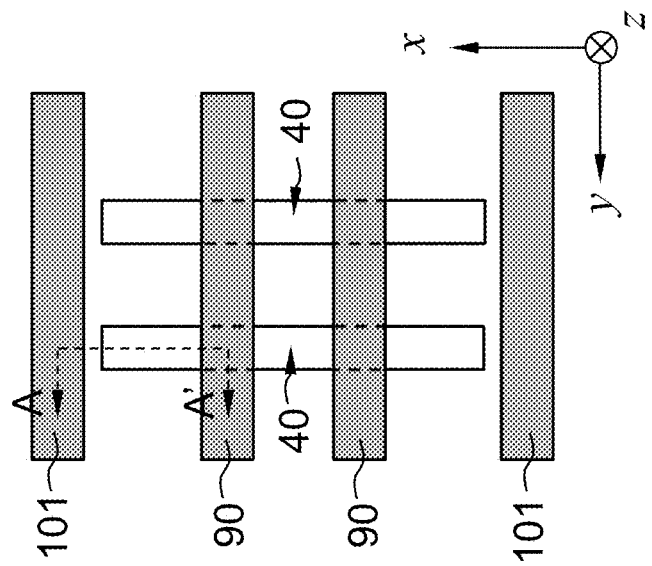
FIG. 8 shows a top plan view of the embodiment of FIG. 7.
Figure 7:
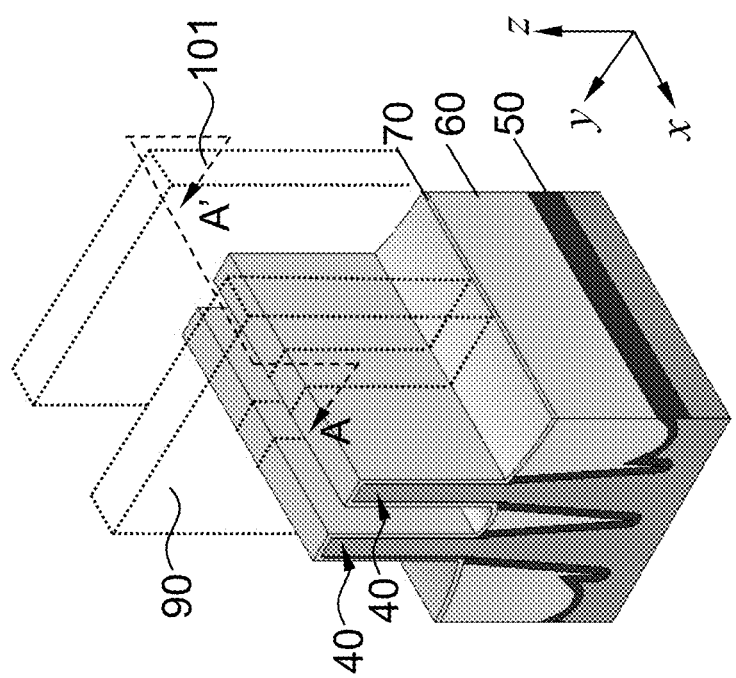
FIG. 7 shows a schematic view of an embodiment after processing the substrate of FIG. 6B.

Hereinafter, a manufacturing operation for a FinFET is explained. FIG. 7 shows a schematic view of the substrate of FIG. 6B with polycrystalline silicon dummy structures 90 and 101, according to an embodiment of the present disclosure and FIG. 8 shows a top plan view of the processed substrate of FIG. 7. In FIG. 7, in some embodiments of the present disclosure, the fin structures 40 are formed on the substrate 10 and extend lengthwise along the x-direction. Each of the fin structures 40 has two fin edge regions at opposite ends along the lengthwise direction of the fin structures 40 along the x-direction. One or more channel regions are formed between the fin ends. In some embodiments of the present disclosure, the separation between the fin structures 40 depends on the device design, such as density of FinFET devices in a processor chip and the performance requirement of the semiconductor device having such a FinFET structure.

Also, in FIG. 7, the polycrystalline silicon dummy structures 101 are formed at a position adjacent to the fin ends of the fin structures 40 and are not formed over the fin structures 40. FIG. 8 shows a gap between the polycrystalline silicon dummy structure 101 and the fin structure 40. Also, polycrystalline silicon dummy structures 90 are formed over regions of the fin structures 40 between the fin edges or fin ends along the lengthwise direction (x direction). The polycrystalline silicon dummy structures 90 are called 'dummy structures' in some embodiments and they will be removed and replaced with the gate structures of the FinFET devices, and the polycrystalline silicon dummy structures 101 are also 'dummy structures' because they will be subsequently removed. FIG. 8 shows a top plan view of the embodiment of FIG. 7. In FIG. 8, the polycrystalline silicon dummy structures 90 cover regions between the edges of fin ends of the fin structures 40 along a lengthwise direction of the fin structures 40. The polycrystalline silicon dummy structures 101 are not formed over the edges of ends of the fin structures 40. In some embodiments, the dummy structures 90 and 101 are formed of amorphous silicon or other suitable material.

FIGS. 9A, 9B, 10A, 10B, 10C, 11A, 11B, 11C, 12A, 12B, 12C, 13A, 13B, 13C, 14A, 14B, 14C, 15A, 15B, 16A, 16B, 17A, 17B, 18A, 18B, 19A, 19B, 20A, 20B, 21A, 21B, 22A, 22B, 23A, 23B, 24A, 24A, 25A, and 25B show operations of manufacturing a semiconductor FinFET device according to an embodiment of the present disclosure. Each of the FIGS. 9A, 10A, 11A, 11C, 12A, 13A, 14A, 15A, 16A, 17A, 18A, 19A, 20A, 21A, 22A, 23A, 24A, and 25A includes a top plan view and each of the FIGS. 9B, 10B, 11B, 11D, 12B, 13B, 14B, 15B, 16B, 17B, 18B, 19B, 20B, 21B, 22B, 23B, 24B, and 25B includes a cross-sectional view of the semiconductor FinFET device along a cut line A-A' in a plane including x and z axes of FIG. 7. Throughout the various views and illustrative embodiments, like reference numbers are used to designate like elements. It is understood that additional operations can be provided before, during, and after processes shown by FIGS. 9A-25B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-6B may be employed in the following embodiments, and detailed explanation thereof may be omitted.

FIGS. 9A and 9B show an operation for fin-end patterning. In particular, FIG. 9A shows a top plan view of an embodiment of the present disclosure. Also, FIG. 9B is a cross-sectional view of the embodiment, showing the layered structure. The fin structure 40 has a bottom region 40i and a top active region 40a which is processed to form a channel region (not shown) and a source/drain region (not shown). As set forth above, after the fin structures are patterned by using the first and second mask layers 31 and 32 as shown in FIGS. 5A or 5B, the insulating material layer 60 is formed to cover the patterned fin structures. Then, a CMP operation is performed to remove the upper portion of the insulating material layer 60 to form a STI layer 60. In this embodiment, the CMP stops on the upper surface of the second mask layer 32. In FIG. 9B, a silicon nitride layer 80a, which corresponds to the first mask layer 31, is formed on the fin active region 40a and an insulating oxide layer 80b, which corresponds to the second mask layer 32, is formed on the silicon nitride layer 80a.

In FIG. 9B, a fin liner 50 is formed on the bottom region 40i of the fin structures 40. A mask pattern 80c is formed on the insulating oxide layer 80b by a photolithographic method. The mask pattern 80c is formed of a light sensitive photoresist material in some embodiments.

FIGS. 10A, 10B, and 10C show operations for etching the insulating oxide layer 80b and the shallow trench isolation (STI) layer 60. The etching includes one or more dry etching and/or wet etching. FIG. 10A shows a top plan view and FIG. 10B shows a cross-sectional view. FIG. 10B shows that the shallow trench isolation (STI) layer 60 is recessed and the fin liner 50 is not etched. In some embodiments of the present disclosure, the STI layer 60 is recessed to have a top surface lower than the top surface of the fin liner 50. In other embodiments of the present disclosure, the STI layer 60 is recessed to have a top surface at the same level as or higher (FIG. 10C) than the top surface of the fin liner 50.

FIGS. 11A and 11B show an operation for chemical and mechanical polishing (CMP) process to remove the layers on the fin structure 40. FIG. 11A shows a top plan view and FIG. 11B shows a cross-sectional view of an operation of manufacturing a semiconductor device according to an embodiment of the disclosure. By the CMP process, the upper surfaces of the fin structures 40a are exposed. In this way, the insulating material layer 60 is formed with a top level lower than the fin liner 50.

FIGS. 11C and 11D show an operation for chemical and mechanical polishing (CMP) process to remove the layers on the fin structure 40. FIG. 11C shows a top plan view and FIG. 11D shows a cross-sectional view of an operation of manufacturing a semiconductor device according to an embodiment of the disclosure. By the CMP process, the upper surfaces of the fin structures 40a are exposed. In this way, the insulating material layer 60 is formed with a top level higher than the fin liner 50.

FIGS. 12A and 12B show that a dummy oxide layer 200, similar to the sacrificial gate dielectric layer 70, is formed on the fin structures 40. In some embodiments, the dummy oxide layer 200 is formed of insulating materials, such as silicon oxide by chemical vapor deposition (CVD), including low pressure CVD (LPCVD) and plasma enhanced CVD (PECVD); and physical vapor deposition (PVD), such as sputtering, or other suitable process.

FIGS. 12A and 12C show that a dummy oxide layer 200, similar to the sacrificial gate dielectric layer 70, is formed on the fin structures 40. In some embodiments, the dummy oxide layer 200 is formed of insulating materials, such as silicon oxide by chemical vapor deposition (CVD), including low pressure CVD (LPCVD) and plasma enhanced CVD (PECVD); and physical vapor deposition (PVD), such as sputtering, or other suitable process.

FIG. 13A shows a top plan view and FIGS. 13B and 13C show cross-sectional views of embodiments having a polycrystalline silicon layer 92 formed over the dummy oxide layer 200. In some embodiments, the polycrystalline silicon layer 92 is formed using chemical vapor deposition (CVD), including low pressure CVD (LPCVD) and plasma enhanced CVD (PECVD); and physical vapor deposition (PVD), such as sputtering; or other suitable process.

FIG. 14A shows a top plan view and FIGS. 14B and 14C show cross-sectional views of embodiments having one or more hard mask layers formed on the polycrystalline silicon layer 92. In some embodiments, the hard mask layer includes a first hard mask layer 94 made of, for example, silicon nitride. The first hard mask layer 94 is formed by using chemical vapor deposition (CVD), including low pressure CVD (LPCVD) and plasma enhanced CVD (PECVD); and physical vapor deposition (PVD), such as sputtering, atomic layer deposition (ALD) or other suitable process.

FIGS. 15A-25B show various views of processes of embodiments having the insulating material layer 60 with a top level lower than the fin liner 50. The processes of forming the embodiments having the insulating material layer 60 with a top level higher than the fin liner 50 are not shown. One of ordinary skill in the art would readily understand, through the processes applied to embodiments having the insulating material layer 60 with a top level lower than the fin liner 50, the similar processes applied to embodiments having the insulating material layer 60 with a top level higher than the fin liner 50.

Figure 15A:
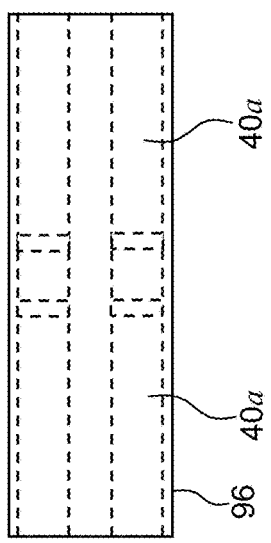
Figure 15B:
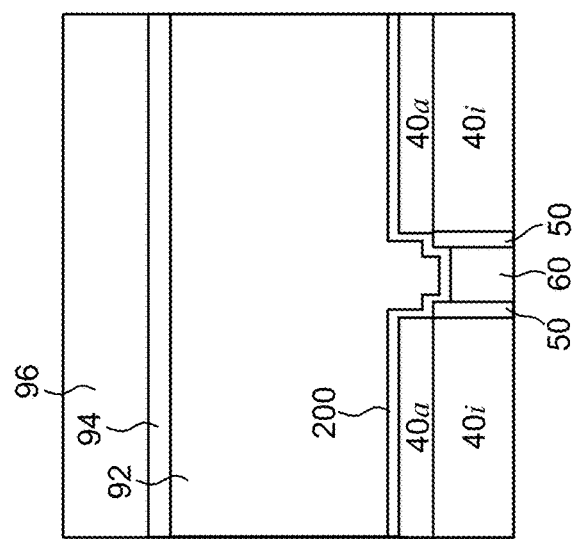

In FIGS. 15A and 15B, a second hard mask layer 96 made of, for example, silicon oxide, is formed on the first hard mask layer 94. The second hard mask layer 96 is formed by using chemical vapor deposition (CVD), including low pressure CVD (LPCVD) and plasma enhanced CVD (PECVD); and physical vapor deposition (PVD), such as sputtering; atomic layer deposition (ALD); or other suitable process. In some embodiments, the first hard mask layer 94 is made of silicon oxide based material, such as silicon oxide, and the second hard mask layer 96 is made of silicon nitride based material as set forth above.

Figure 16A:
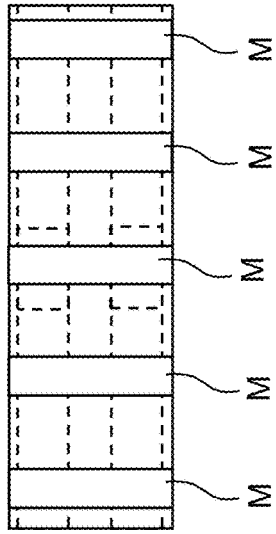
Figure 16B:
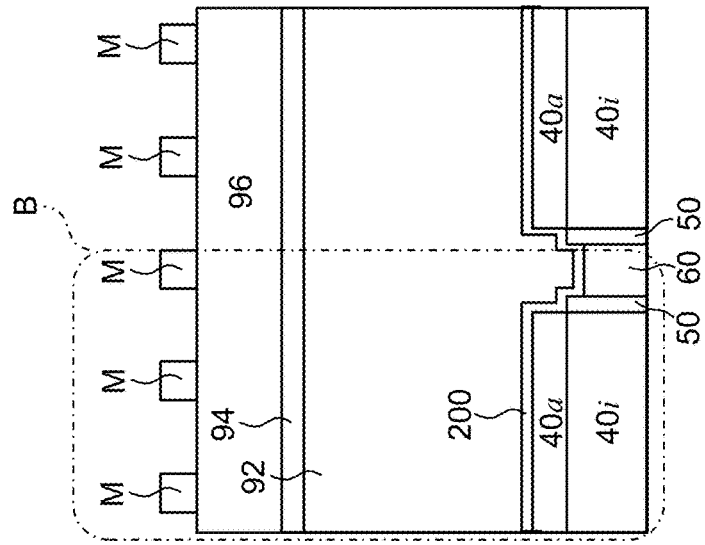

Then, as shown in FIGS. 16A and 16B, a mask pattern M is formed on the second hard mask layer 96 by spin coating and photolithographic techniques. The mask pattern M is formed of a light-sensitive photoresist layer. The region B outlined by the dotted line will be discussed in further details in FIGS. 17A-25B. FIGS. 17A and 17B show the enlarged region B of the embodiment of FIG. 16B.

FIGS. 18A and 18B show an operation of etching the oxide hard mask layer 96, silicon nitride hard mask layer 94, and the polycrystalline silicon layer 90' using the mask pattern M. The etching is anisotropic dry etching in some embodiments. Through this operation, the polycrystalline dummy silicon structures 90 and 101 are defined. The polycrystalline dummy silicon structure 90 is formed on a region in the fin structure 40, and the polycrystalline silicon dummy structure 101 is formed on a region spaced-apart from the fin end of the fin structure 40, e.g., between the ends of two adjacent fin structures. FIGS. 19A and 19B show an operation according to some embodiments of the present disclosure. In this operation, a gate sidewall spacer layer 150 is conformally formed on the patterned polycrystalline silicon dummy structures of FIGS. 18A and 18B. After the gate sidewall spacer layer 150 is formed, anisotropic etching is performed to remove the gate sidewall spacer layer 150 formed on the top of the polycrystalline silicon dummy structures 90 and 101 and on the upper surface of the fin structure 40 (as shown in FIGS. 19A and 19B). The conformally formed gate sidewall spacer layer 150 fully covers the polycrystalline dummy silicon structure 101 because the fin end spacer plug 142 fills a space adjacent to an end of the fin and a narrow gap is not formed. The gate sidewall spacer layer 150 protects the source/drain epitaxial layer from being etched. Since the gate sidewall spacer layer 150 is completely formed filling the space between the fins, a subsequently formed source/drain epitaxial layer is fully protected from a subsequent etch process.

FIGS. 21A and 21B show an operation according to an embodiment of the present disclosure. In FIGS. 21A and 21B, source/drain epitaxial layer 120 is deposited in the source/drain space 110 formed in the fin active region 40a. In some embodiments, the source/drain epitaxial layer includes SiP, SiGe, etc. The source/drain epitaxial layer 120 is separated from the polycrystalline silicon dummy structures 90 and 101 by the gate sidewall spacers 150 of the polycrystalline silicon dummy structures 101.

Figure 23A:
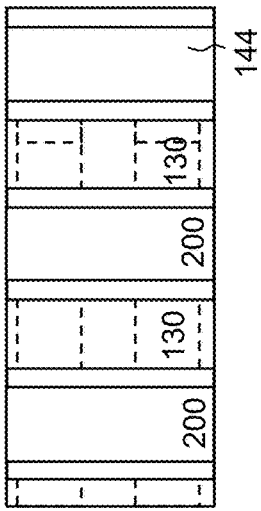
Figure 24A:
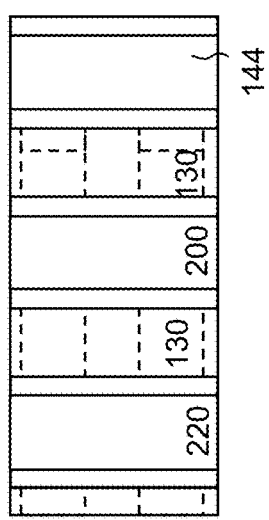
Figure 23B:
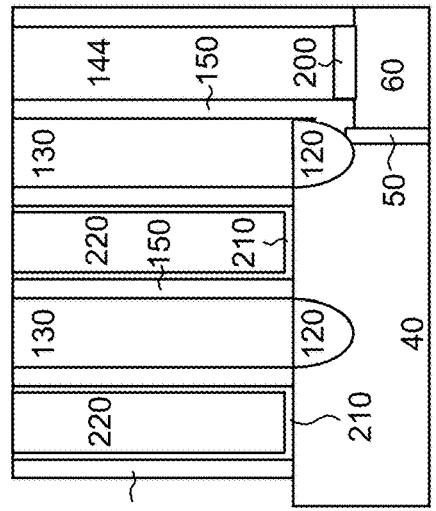
Figure 24B:
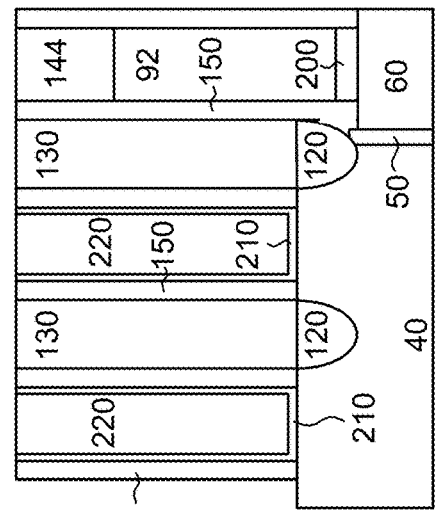

FIGS. 22A and 22B show an operation of depositing an interlayer dielectric (ILD) layer 130 on the source/drain epitaxial layer 120. In some embodiments, a contact etch stop layer (CESL) is formed over the structure of FIGS. 21A and 21B before the ILD layer 130 is formed. Then, the polycrystalline silicon dummy structure 101 is partially removed without removing the sidewall spacers 150, in some embodiments of the present disclosure. Further, a spacer dummy gate cap 144 is formed in the space formed by partially removing polycrystalline silicon layer 101 as shown in FIGS. 23A and 23B. The spacer dummy gate cap 144 serves to preserve the source/drain epitaxial layer 120 at the fin end of the fin structure 40 during etching processes. In this way, the source/drain epitaxial layer 120 is not etched even if the gate sidewall spacer layer 150 which is supposed to protect the source/drain epitaxial layer 120 from etching is not fully formed. Further, the polycrystalline silicon dummy structures 90 are removed without removing sidewall spacers 150, and a gate dielectric layer 210 and a gate electrode 220 are formed as shown in FIGS. 24A and 24B. The gate dielectric layer 210 includes, for example, a high-k dielectric material, such as hafnium oxide, and the gate electrode 220 includes one or more layers of conductive materials.

Figure 25A:
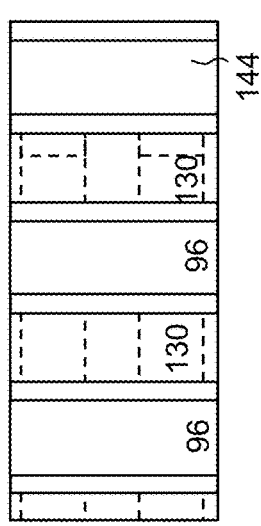
Figure 25B:
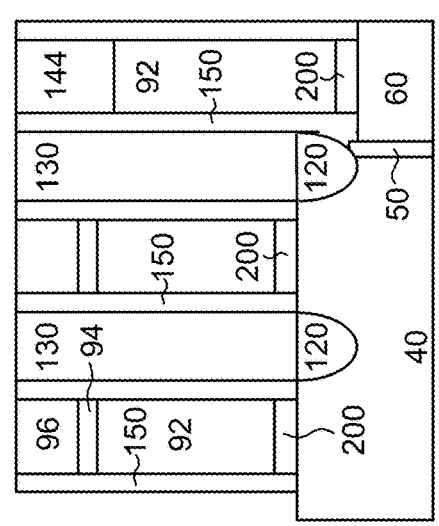

In other embodiments, the polycrystalline silicon dummy structure 101 is fully removed without removing the sidewall spacers 150, and a spacer dummy gate cap 144 is formed in the space formed by fully removing polycrystalline silicon layer 101. Then, as shown in FIGS. 25A and 25B, a gate dielectric layer 210 and a gate electrode 220 are formed.

In some embodiments, the spacer dummy gate cap 144 is formed of a material including silicon nitride based material. The spacer dummy gate cap is formed by chemical vapor deposition (CVD), including low pressure CVD (LPCVD) and plasma enhanced CVD (PECVD); and physical vapor deposition (PVD) such as sputtering; atomic layer deposition (ALD) or other suitable process. In some embodiments, the silicon nitride based material includes silicon nitride, silicon oxynitride, silicon carbon nitride, and silicon carbon oxynitride.

Figure 27:
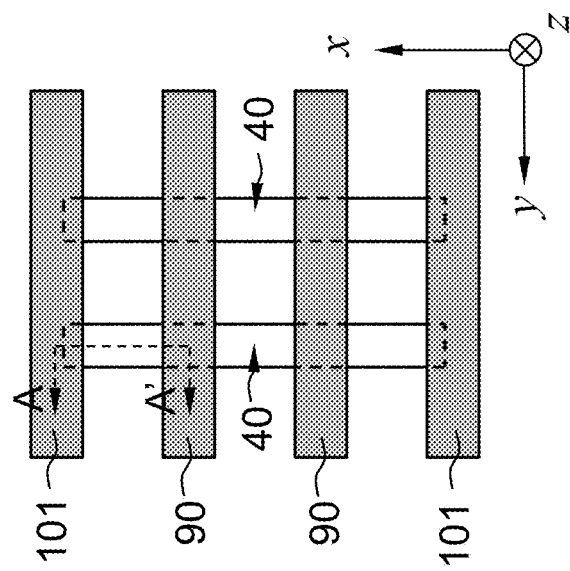
FIG. 27 shows a top plan view of the embodiment of FIG. 26.
Figure 26:
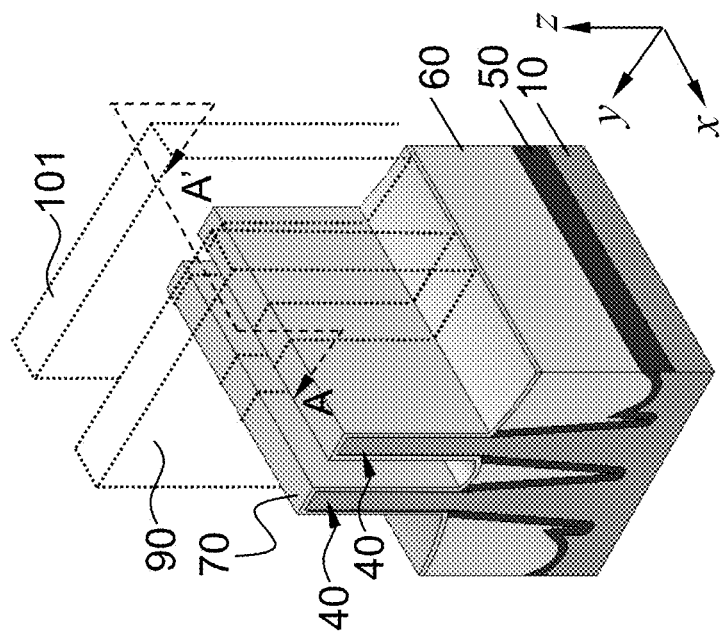
FIG. 26 shows a schematic view of another embodiment after processing the substrate of FIG. 6B.

Hereinafter, a manufacturing operation for a FinFET according to another embodiment is explained. FIG. 26 shows a schematic view of the substrate of FIG. 6B with polycrystalline silicon dummy structures 90 and 100, according to an embodiment of the present disclosure and FIG. 27 shows a top plan view of the processed substrate of FIG. 26. In FIG. 26, in some embodiments of the present disclosure, the fin structures 40 are formed on the substrate 10 and extend lengthwise along the x-direction. Each of the fin structures 40 has two fin edge regions at opposite ends along the lengthwise direction of the fin structures 40 in the x-direction. One or more channel regions are formed between the fin ends. In some embodiments of the present disclosure, the separation between the fin structures 40 depends on the device design.

Also, in FIG. 26, the polycrystalline silicon dummy structure 101 is formed over the fin ends of the fin structures 40. As shown in FIG. 27, there are no gaps between the polycrystalline silicon dummy structure 101 and the fin structure 40, and the polycrystalline silicon dummy structure 100 overlaps the ends of the fin structure 40. The polycrystalline silicon dummy structures 90 are formed over regions of the fin structures 40 between the fin ends along the lengthwise direction (i.e. x direction). FIG. 27 shows a top plan view of the embodiment of FIG. 26. In some embodiments, the dummy structures 90 and 101 are formed of amorphous silicon or other suitable material.

FIGS. 28A, 28B, 29A, 29B, 29C, 30A, 30B, 30C, 30D, 31A, 31B, 31C, 32A, 32B, 32C, 33A, 33B, 33C, 34A, 34B, 35A, 35B, 36A, 36B, 37A, 37B, 38A, 38B, 39A, 39B, 40A, 40B, 41A, 41B, 42A, 42B, 43A and 43B show operations of manufacturing a semiconductor FinFET device according to an embodiment of the present disclosure. Each of FIGS. 28A, 29A, 30A, 30C, 31A, 32A, 33A, 34A, 35A, 36A, 37A, 38A, 39A, 40A, 41A, 42A and 43A includes a top plan view and each of FIGS. 28B, 29B, 29C, 30B, 30D, 31B, 31C, 32B, 32C, 33B, 33C, 34B, 35B, 36B, 37B, 38B, 39B, 40B, 41B, 42B and 43B includes a cross-sectional view of the semiconductor FinFET device along a cut line A-A' in a plane including x and z axes of FIG. 1. Throughout the various views and illustrative embodiments, like reference numbers are used to designate like elements. It is understood that additional operations can be provided before, during, and after processes shown by FIGS. 28A-43B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-25B may be employed in the following embodiments, and detailed explanation thereof may be omitted.

FIGS. 28A and 28B show an operation for fin-end patterning. In particular, FIG. 28A shows a top plan view of an embodiment of the present disclosure. Also, FIG. 28B shows a cross-sectional view of the embodiment, indicating the layering structure. The fin structure 40 has a bottom region 40i and a top active region 40a which is processed to form a channel region (not shown) and a source/drain region (not shown). As set forth above, after the fin structures 40 are patterned by using the first and second mask layers 31 and 32 as shown in FIGS. 5A or 5B, the insulating material layer 60 is formed to cover the patterned fin structures 40. Then, a CMP operation is performed to remove the upper portion of the insulating material layer 60 to form an STI layer 60. In this embodiment, the CMP stops on the upper surface of the second mask layer 32. In FIGS. 28A and 28B, a silicon nitride layer 80a, which corresponds to the first mask layer 31, is formed on the fin active region 40a, and an insulating oxide layer 80b, which corresponds to the second mask layer 32, is formed on the silicon nitride layer 80a.

In FIG. 28B, a fin liner 50 is formed on the bottom region 40i of the fin structures 40. A mask pattern 80c is subsequently formed on the insulating oxide layer 80b by a photolithographic method. The mask pattern 80c is formed of a light sensitive photoresist material in some embodiments.

FIGS. 29A and 29B show an operation for etching the insulating oxide layer 80b and the shallow trench isolation (STI) layer 60. The etching includes one or more dry etching and/or wet etching operations. FIG. 29A shows a top plan view, and FIG. 29B shows a cross-sectional view of the embodiment. FIG. 29B shows that the shallow trench isolation (STI) layer 60 is recessed and the fin liner 50 is not etched. In some embodiments of the present disclosure, the STI layer 60 is recessed to have a top surface of a level lower than the top surface of the fin liner 50 (FIG. 29B). In some embodiments of the present disclosure, the STI layer 60 is recessed to have a top surface at the higher level than the top surface of the fin liner 50 (FIG. 29C).

FIGS. 30A and 30B show an operation for chemical and mechanical polishing (CMP) process to remove the layers over the fin structure 40. By the CMP process, the upper surfaces of the fin structures 40 are exposed.

FIGS. 30C and 30D show an operation for chemical and mechanical polishing (CMP) process to remove the layers over the fin structure 40. By the CMP process, the upper surfaces of the fin structures 40 are exposed.

FIGS. 31A and 31B show that a dummy oxide layer 200, similar to the sacrificial gate dielectric layer 70 (FIG. 6A), is formed on the fin structures 40. In some embodiments, the dummy oxide layer 200 is formed of insulating materials such as silicon oxide by chemical vapor deposition (CVD), including low pressure CVD (LPCVD) and plasma enhanced CVD (PECVD); and physical vapor deposition (PVD) such as sputtering; or other suitable process.

In FIGS. 32A, 32B, and 32C, a polycrystalline silicon layer 92 is formed over the dummy oxide layer 200. In some embodiments, the polycrystalline silicon layer 92 is formed using chemical vapor deposition (CVD), including low pressure CVD (LPCVD) and plasma enhanced CVD (PECVD); and physical vapor deposition (PVD) such as sputtering; or other suitable process.

One or more hard mask layers are formed on the polycrystalline silicon layer 92 as shown in FIGS. 33A, 33B, and 33C. In some embodiments, the hard mask layer includes a first hard mask layer 94 made of, for example, silicon nitride. The hard mask layer 94 is formed by using chemical vapor deposition (CVD), including low pressure CVD (LPCVD) and plasma enhanced CVD (PECVD); and physical vapor deposition (PVD) such as sputtering; atomic layer deposition (ALD) or other suitable process.

FIGS. 34A-43B show cross-sectional views of processes of embodiments having the STI layer 60 recessed to have a top surface at a lower level than the top surface of the fin liner 50 as an example. The processes of embodiments having the STI layer 60 recessed to have a top surface at a higher level than the top surface of the fin liner 50 are not shown. One of ordinary skill in the art would readily understand, through the processes applied in embodiments having the STI layer 60 recessed to have a top surface at a lower level than the top surface of the fin liner 50, the similar processes applied in embodiments having top surfaces of the STI layer 60 at the same height or above the fin liner layers 50.

Figure 34A:
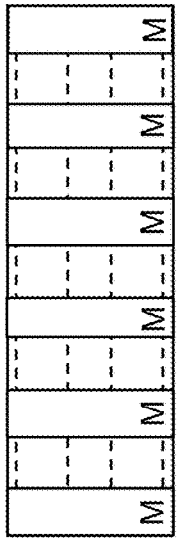
Figure 34B:
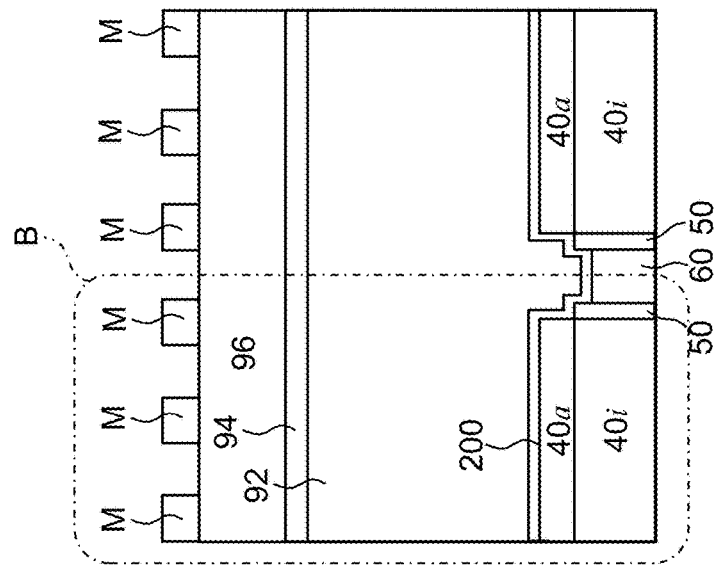
Figure 35A:
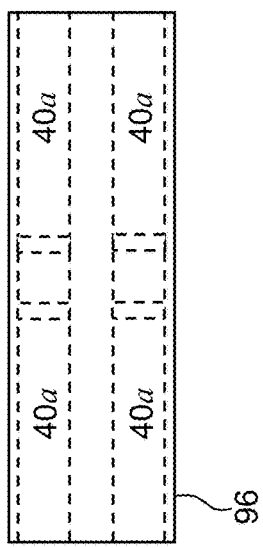
Figure 35B:
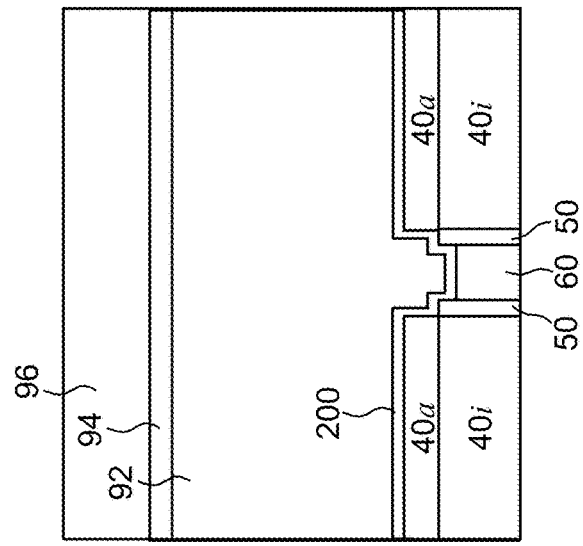

In FIGS. 34A and 43B, a second hard mask layer 96 made of, for example, silicon oxide, is formed on the first hard mask layer 94. The second hard mask layer 96 is formed by using chemical vapor deposition (CVD), including low pressure CVD (LPCVD) and plasma enhanced CVD (PECVD), and physical vapor deposition (PVD) such as sputtering, atomic layer deposition (ALD) or other suitable process. Then, as shown in FIGS. 35A and 35B, a mask pattern M is formed on the second hard mask layer 96 by spin coating and a photolithographic method. The mask pattern M is formed of a light-sensitive photoresist layer in some embodiments. The region B outlined by the dotted line will be discussed in further details in FIGS. 36A and 36B. FIGS. 36A and 36B show the enlarged region B of the embodiment of FIG. 35B.

FIGS. 37A and 37B show an operation of etching the oxide hard mask layer 96, silicon nitride hard mask layer 94, and the polycrystalline silicon layer 92 using the mask pattern M. The etching is anisotropic dry etching in some embodiments. Through this operation, the polycrystalline dummy silicon structures 90 and 101 are defined. The polycrystalline silicon dummy structures 90 are formed on a region in the fin structure 40, and the polycrystalline silicon dummy structures 101 are formed on an edge of the fin end of the fin structure 40.

FIGS. 38A and 38B show an operation according to some embodiments of the present disclosure. In this operation, a gate sidewall spacer layer 150 is conformally formed on the patterned polycrystalline silicon dummy structures 90 and 101 of FIGS. 38A and 38B. After the gate sidewall spacer layer 150 is formed, anisotropic etching is performed to remove the gate sidewall spacer layer 150 formed on the top of the polycrystalline silicon dummy structures 90 and 101 and on the upper surface of the fin structure 40.

FIGS. 39A and 39B show an operation according to an embodiment of the present disclosure. In FIGS. 39A and 39B, a source/drain space 110 is formed in the fin active region 40a by etching of the fin active region 40a, at the region between the polycrystalline silicon dummy structures 90 and the polycrystalline silicon dummy structures 101.

FIGS. 40A and 40B show an operation according to an embodiment of the present disclosure. In FIGS. 40A and 40B, a source/drain epitaxial layer 120 including SiP is deposited in the source/drain space 110 formed in the fin active region 40a. The source/drain epitaxial layer 120 is separated from the polycrystalline silicon dummy structures 90 and 100 by the sidewall spacer layer 150.

FIGS. 41A and 41B show an operation of depositing an insulating dielectric layer 130 on the source/drain epitaxial layer 120. Then, the polycrystalline silicon dummy structure 101 is partially removed without removing the sidewall spacers 150, in some embodiments of the present disclosure. Further, a spacer dummy gate cap 144 is formed in the space formed by partially removing polycrystalline silicon layer 101 as shown in FIGS. 41A and 41B. The spacer dummy gate cap 144 serves to preserve the source/drain epitaxial layer 120 at the end of the fin structure 40. Further, the polycrystalline silicon dummy structures 90 are removed without removing sidewall spacers 150, and a gate dielectric layer 210 and a gate electrode 220 are formed as shown in FIGS. 42A and 42B. The gate dielectric layer 210 includes, for example, high-k dielectric material, such as hafnium oxide, and the gate electrode 220 includes one or more layers of conductive materials.

In other embodiments, the polycrystalline silicon dummy structure 101 is fully removed without removing the sidewall spacers 150, and a spacer dummy gate cap 144 is formed in the space formed by fully removing polycrystalline silicon layer 101. Then, as shown in FIGS. 43A and 43B, a gate dielectric layer 210 and a gate electrode 220 are formed.

In some embodiments, the spacer dummy gate cap 144 is formed of a material including silicon nitride based material. The spacer dummy gate cap is formed by chemical vapor deposition (CVD), including low pressure CVD (LPCVD) and plasma enhanced CVD (PECVD); and physical vapor deposition (PVD) such as sputtering; atomic layer deposition (ALD) or other suitable process. In some embodiments, the silicon nitride based material includes silicon nitride, silicon oxynitride, silicon carbon nitride, and silicon carbon oxynitride.

In the above embodiments, the positions of the polycrystalline silicon dummy structures 101 (FIGS. 26-43B) and 101 (FIGS. 7-25B) are different. Because of the structure of the sidewall spacer 150 and the spacer dummy gate 144 covering the polycrystalline silicon dummy structures 100 and 101 and the fin 40, the source/drain epitaxial layers 120 can still be maintained intact without being etched or chemically altered through subsequent semiconductor processing.

Overlay shift causes misalignment of structures and the formation of an undesirable narrow gap, which does not allow the protective layers of a device to be fully formed, thereby, causing defects in a device. In the foregoing embodiments, a spacer dummy gate 144 is employed to protect the source/drain epitaxial layer and fin ends during dummy polycrystalline silicon removal.

The various embodiments or examples described herein offer several advantages over the existing art. For example, in the present disclosure, the spacer dummy gate 144 serves to preserve the source/drain epitaxial layer 120 at fin end of the fin structure 80 even when overlay shift occurs and the spacer layers 150 are not completely formed due to the narrowness of a gap adjacent to a fin end. It will be understood that not all advantages have been necessarily discussed herein, no particular advantage is required for all embodiments or examples, and other embodiments or examples may offer different advantages.

In accordance with an aspect of the present disclosure, a method of manufacturing a semiconductor device includes forming a first isolation insulating layer between fins. A dummy oxide layer is formed over the fins and the first isolation insulating layer. Dummy structures are formed on the fins and on edge regions of the fins at an end in a lengthwise direction of the fins. Sidewall spacer layers are formed on the dummy structures. Source/drain regions of the fins, which are not covered by the sidewall spacer layers are etched thereby forming source/drain spaces. Source/drain epitaxial layers are formed in the source/drain spaces. Interlayer dielectric layers are formed on the source/drain epitaxial layers. A portion of the dummy structures are removed, and spacer dummy gate layers are formed where the portion of the dummy structures was removed. In an embodiment, the removing a portion of the dummy structures removes upper portions of the dummy structures. In an embodiment, the removing a portion of the dummy structures completely removes the dummy structures. In an embodiment, the forming the spacer dummy gate layers where the portion of the dummy structures was removed fills the removed upper portions with the spacer dummy gate layers. In an embodiment, the forming the spacer dummy gate layers where a portion of the dummy structures was removed fills spaces of the removed dummy structures with the spacer dummy gate layers. In an embodiment, the method includes forming fin liners on the fins. In an embodiment, the forming the dummy structures includes forming a first hard mask layer. In an embodiment, the forming the dummy structures includes forming a second hard mask layer over the first hard mask layer. In an embodiment, the source/drain epitaxial layers include SiP.

In accordance with another aspect of the present disclosure, a method of manufacturing a semiconductor device includes forming an insulating layer on a surface of an end of a fin along a lengthwise direction of the fin. A dummy oxide layer is formed on the insulating layer and the fin. Silicon layers are formed on the fin and on a region spaced-apart from the fin. A sidewall spacer layer is formed on the silicon layers. A source/drain region of the fin, which is not covered by the sidewall spacer layers, is etched thereby forming a source/drain space. A source/drain epitaxial layer is formed in the source/drain space. The silicon layer formed on the region spaced-apart from the fin is etched. A spacer dummy gate layer is formed where the silicon layer formed on the region spaced-apart from the fin was etched. In an embodiment, the etching the silicon layer completely removes the silicon layer. In an embodiment, the etching the silicon layer partially removes the silicon layer. In an embodiment, the spacer dummy gate layer is formed in a space of the completely removed silicon layer. In an embodiment, the spacer dummy gate layer is formed in a space of the partially removed silicon layer. In an embodiment, the forming the silicon layers includes forming a first hard mask layer. In an embodiment, the forming the silicon layers includes forming a second hard mask layer over the first hard mask layer. In an embodiment, the source/drain epitaxial layer includes SiP.

In accordance with another aspect of the present disclosure, in a method of manufacturing a semiconductor device, a fin is formed. A first isolation insulating layer is formed around a bottom portion of the fin. A dummy oxide layer is formed over the fin and the first isolation insulating layer. A first dummy structure is formed over the fin and a second dummy structure is formed over an edge region of the fin at an end in a lengthwise direction of the fin. Sidewall spacer layers are formed on the first and second dummy structures. Source/drain regions of the fin, which are not covered by the sidewall spacer layers, etched, thereby forming source/drain spaces. Source/drain epitaxial layers are formed in the source/drain spaces. An interlayer dielectric layer is formed over the source/drain epitaxial layers and the first and second dummy structures. The first dummy structure is removed thereby forming a first gate space, and at least a part of the second dummy structure is removed thereby forming a second gate space. A metal gate structure is formed in the first gate space and a spacer dummy gate layer is formed in the second gate space. In an embodiment, in the removing at least a part of the second dummy structure, only an upper portion of the second dummy structure is removed, thereby leaving a remaining portion of the second dummy structure in the second gate space. In an embodiment, the spacer dummy gate layer is formed on the remaining portion of the second dummy structure. In an embodiment, the second dummy structure is completely removed. In an embodiment, the spacer dummy gate layer fully fills the second gate space. In an embodiment, in the removing the second dummy structure, the dummy oxide layer remains. In an embodiment, a fin liner layer is formed on the fin. In an embodiment, the spacer dummy gate layer includes one selected from the group consisting of silicon nitride, silicon oxynitride, silicon carbon nitride, and silicon carbon oxynitride. In an embodiment, the source/drain epitaxial layers include SiP.

In accordance with another aspect of the present disclosure, in a method of manufacturing a semiconductor device, first fin and second fin are formed. The first and second fins are aligned along a lengthwise direction of the first and second fins. A dummy oxide layer is formed on the insulating layer and the first and second fins. A first dummy gate layer is formed over the first fin and a second dummy gate is formed on a region between the first and second fins. Sidewall spacer layers are formed on the first and second dummy gate layers. Source/drain regions of the first fin, which are not covered by the sidewall spacer layers, are etched, thereby forming source/drain spaces. Source/drain epitaxial layers are formed in the source/drain spaces. An interlayer dielectric layer is formed over the source/drain epitaxial layers and the first and second dummy gate layers. The first dummy gate layer is removed thereby forming a first gate space, and at least a part of the second dummy gate layer is removed thereby forming a second gate space. A metal gate structure is formed in the first gate space and a spacer dummy gate layer is formed in the second gate space. In an embodiment, in the removing at least a part of the second dummy gate layer, only an upper portion of the second dummy gate layer is removed, thereby leaving a remaining portion of the second dummy gate layer in the second gate space. In an embodiment, the spacer dummy gate layer is formed on the remaining portion of the second dummy gate layer. In an embodiment, the second dummy gate layer is completely removed. In an embodiment, the spacer dummy gate layer fully fills the second gate space. In an embodiment, the spacer dummy gate layer is formed on the dummy oxide layer. In an embodiment, a fin liner layer is formed on the first and second fins. In an embodiment, the spacer dummy gate layer includes one selected from the group consisting of silicon nitride, silicon oxynitride, silicon carbon nitride, and silicon carbon oxynitride.

In accordance with another aspect of the present disclosure, a semiconductor device includes a plurality of fins extending in a first direction over a substrate. A fin liner is disposed over an end surface of each of the plurality of fins. An insulating layer is disposed over the plurality of fins. Gate electrodes extend in a second direction substantially perpendicular to the first direction disposed over the insulating layer. A source/drain epitaxial layer is disposed in a source/drain space in each of the plurality of fins. A silicon layer is disposed over a region spaced-apart from the fins, and a spacer dummy gate disposed over the silicon layer. In an embodiment, the spacer dummy gate is formed of a material including a silicon nitride based material. In an embodiment, the silicon nitride based material includes silicon nitride, silicon oxynitride, silicon carbon nitride, and silicon carbon oxynitride.

In accordance with another aspect of the present disclosure, a semiconductor device includes a first fin and a second fin in a first direction and aligned in the first direction over a substrate, an isolation insulating layer disposed around lower portions of the first and second fins, a first gate electrode extending in a second direction crossing the first direction and a spacer dummy gate layer, and a source/drain epitaxial layer in a source/drain space in the first fin. The source/drain epitaxial layer is adjacent to the first gate electrode and the spacer dummy gate layer with gate sidewall spacers disposed therebetween, and the spacer dummy gate layer includes one selected from the group consisting of silicon nitride, silicon oxynitride, silicon carbon nitride, and silicon carbon oxynitride. In an embodiment, the spacer dummy gate is disposed over an edge of the first fin. In an embodiment, the spacer dummy gate is disposed over a region between the first and second fins.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin extending in a first direction and having a first edge, a second edge and a middle portion between the first edge and the second edge along the first direction;
   a fin liner layer disposed on side face of the fin;
   an isolation insulating layer disposed around a bottom portion of the fin;
   a gate electrode disposed over the middle portion of the fin;
   a spacer dummy gate electrode disposed over the first edge of the fin, the spacer dummy gate electrode including first and second gate sidewall spacers;
   a source/drain epitaxial layer disposed between the gate electrode and the spacer dummy gate electrode; and
   an oxide layer disposed in direct contact over a portion of an upper surface of the isolation insulating layer and disposed in direct contact with a portion of at least the first gate sidewall spacer when viewed in cross-section,
   the oxide layer is disposed in direct contact over portions of an upper surface and side surface of the fin liner layer when viewed in cross-section, and
   wherein the spacer dummy gate electrode is entirely formed of a dielectric material.

2. The semiconductor device of claim 1, wherein the oxide layer is disposed between the spacer dummy gate electrode and the first edge of the fin.

3. The semiconductor device of claim 2, wherein the oxide layer is disposed in direct contact with a portion of the second gate sidewall spacer when viewed in cross-section.

4. The semiconductor device of claim 1, wherein the spacer dummy gate electrode is made of silicon nitride.

5. The semiconductor device of claim 1, wherein the spacer dummy gate electrode is made of silicon carbon nitride.

6. The semiconductor device of claim 1, wherein the spacer dummy gate electrode is made of silicon carbon oxynitride.

7. The semiconductor device of claim 1, wherein the spacer dummy gate electrode is made of silicon oxynitride.

8. The semiconductor device of claim 1, wherein a top of the fin liner layer is higher than a top of the isolation insulating layer.

9. The semiconductor device of claim 1, wherein the source/drain epitaxial layer includes SiP.

10. The semiconductor device of claim 1, wherein the oxide layer includes silicon oxide.

11. A semiconductor device, comprising:
    a first fin and a second fin, the first and second fins aligned along a first direction;
    a first fin liner layer disposed on a first side face of the first fin and a second fin liner layer disposed on a second side face of the second fin;
    an isolation insulating layer disposed on bottom parts of the first and second fins;
    a first gate structure disposed over the first fin, a second gate structure disposed over an edge of the first fin but not over the second fin and a third gate structure disposed over the second fin but not over the first fin, wherein the second gate structure is a dummy spacer gate structure including a dielectric layer disposed between first and second gate sidewall spacers; and
    an oxide layer disposed in direct contact over a portion of an upper surface of the isolation insulating layer and disposed in direct contact with a portion of the first gate sidewall spacer when viewed in cross-section,
    wherein the oxide layer is disposed in direct contact over portions of an upper surface and side surface of each of the first and second fin liner layers when viewed in cross-section.

12. The semiconductor device of claim 11, wherein the oxide layer is disposed between the dielectric layer and the edge of the first fin.

13. The semiconductor device of claim 12, wherein the oxide layer is disposed in direct contact with a portion of a second gate sidewall spacer when viewed in cross-section.

14. The semiconductor device of claim 11, wherein the dielectric layer includes one selected from the group consisting of silicon nitride, silicon oxynitride, silicon carbon nitride, and silicon carbon oxynitride.

15. The semiconductor device of claim 11, wherein a top of the fin liner layer is higher than a top of the isolation insulating layer.

16. The semiconductor device of claim 11, wherein the oxide layer includes silicon oxide.

17. A semiconductor device, comprising:
    a first fin and a second fin, the first and second fins aligned along a first direction;
    a first fin liner layer disposed on a first side face of the first fin and a second fin liner layer disposed on a second side face of the second fin;
    an isolation insulating layer disposed on bottom parts of the first and second fins;
    a first gate structure disposed over the first fin, a second gate structure disposed over an edge of the first fin but not over the second fin, a third gate structure disposed over the second fin, and a fourth gate structure disposed over an edge of the second fin but not over the first fin, the first to fourth gate structures extending in a second direction crossing the first direction and arranged in parallel with each other in the first direction and arranged in an order of the first gate structure, the second gate structure, the fourth gate structure and the third gate structure in the first direction, wherein the second and fourth gate structures are a dummy spacer gate structure, respectively, and the second gate structure includes first and second gate sidewall spacers; and an oxide layer disposed in direct contact over a portion of an upper surface of the isolation insulating layer and disposed in direct contact with a portion of the first gate sidewall spacer when viewed in cross-section, wherein the oxide layer is disposed in direct contact over portions of an upper surface and side surface of each of the first and second fin liner layers when viewed in cross-section.

18. The semiconductor device of claim 17, wherein the dummy spacer gate structure includes a dielectric layer disposed over a poly silicon layer.

19. The semiconductor device of claim 17, wherein the dummy spacer gate structure includes a dielectric layer disposed between the first and second gate sidewall spacers.

20. The semiconductor device of claim 17, wherein the oxide layer includes silicon oxide.

* * * * *